(12) United States Patent
Smith et al.

(10) Patent No.: US 10,319,827 B2
(45) Date of Patent: Jun. 11, 2019

(54) HIGH VOLTAGE TRANSISTOR USING BURIED INSULATING LAYER AS GATE DIELECTRIC

(71) Applicant: GLOBALFOUNDRIES Inc., Grand Cayman (KY)

(72) Inventors: Elliot John Smith, Dresden (DE); Nigel Chan, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 212 days.

(21) Appl. No.: 15/647,403

(22) Filed: Jul. 12, 2017

(65) Prior Publication Data

US 2019/0019876 A1    Jan. 17, 2019

(51) Int. Cl.
*H01L 29/51* (2006.01)
*H01L 29/165* (2006.01)
*H01L 29/66* (2006.01)

(52) U.S. Cl.
CPC .......... *H01L 29/517* (2013.01); *H01L 29/165* (2013.01); *H01L 29/665* (2013.01); *H01L 29/6653* (2013.01); *H01L 29/66628* (2013.01); *H01L 29/66772* (2013.01)

(58) Field of Classification Search
CPC ............. H01L 29/517; H01L 29/66772; H01L 29/66628; H01L 29/165; H01L 29/665; H01L 29/6653
See application file for complete search history.

(56) References Cited

U.S. PATENT DOCUMENTS

| | | | |
|---|---|---|---|
| 7,151,303 B2 | 12/2006 | Wang et al. | |
| 7,314,794 B2* | 1/2008 | Nowak | H01L 21/743 257/E21.412 |
| 7,745,879 B2 | 6/2010 | Bryant et al. | |
| 7,939,395 B2 | 5/2011 | Abadeer et al. | |
| 2002/0192911 A1* | 12/2002 | Parke | H01L 29/78645 438/270 |
| 2007/0029620 A1* | 2/2007 | Nowak | H01L 21/743 257/369 |
| 2008/0111195 A1* | 5/2008 | Atanackovic | H01L 29/4908 257/366 |
| 2008/0157211 A1* | 7/2008 | Wang | H01L 21/26586 257/369 |
| 2012/0168865 A1* | 7/2012 | Liang | H01L 29/66545 257/348 |
| 2012/0193714 A1* | 8/2012 | Okihara | H01L 21/76254 257/347 |

(Continued)

*Primary Examiner* — Charles D Garber
*Assistant Examiner* — S M Sohel Imtiaz
(74) *Attorney, Agent, or Firm* — Amerson Law Firm, PLLC

(57) ABSTRACT

A high voltage transistor may be formed on the basis of well-established CMOS techniques by using a buried insulating material of an SOI architecture as gate dielectric material, while the gate electrode material may be provided in the form of a doped semiconductor region positioned below the buried insulating layer. The high voltage transistor may be formed with high process compatibility on the basis of a process flow for forming sophisticated fully depleted SOI transistors, wherein, in some illustrative embodiments, the high voltage transistor may also be provided as a fully depleted transistor configuration.

20 Claims, 16 Drawing Sheets

(56) References Cited

U.S. PATENT DOCUMENTS

| | | | |
|---|---|---|---|
| 2012/0270383 A1* | 10/2012 | Abe | H01L 29/04 438/479 |
| 2013/0093002 A1* | 4/2013 | Zhu | H01L 29/66772 257/329 |
| 2013/0146953 A1* | 6/2013 | Cheng | H01L 21/84 257/296 |
| 2016/0276428 A1* | 9/2016 | Faul | H01L 29/4916 |
| 2016/0372572 A1* | 12/2016 | Fung | H01L 29/66295 |
| 2017/0059513 A1* | 3/2017 | Afzali-Ardakani | G01N 27/4145 |
| 2017/0294359 A1* | 10/2017 | Cantoro | H01L 21/02167 |

* cited by examiner

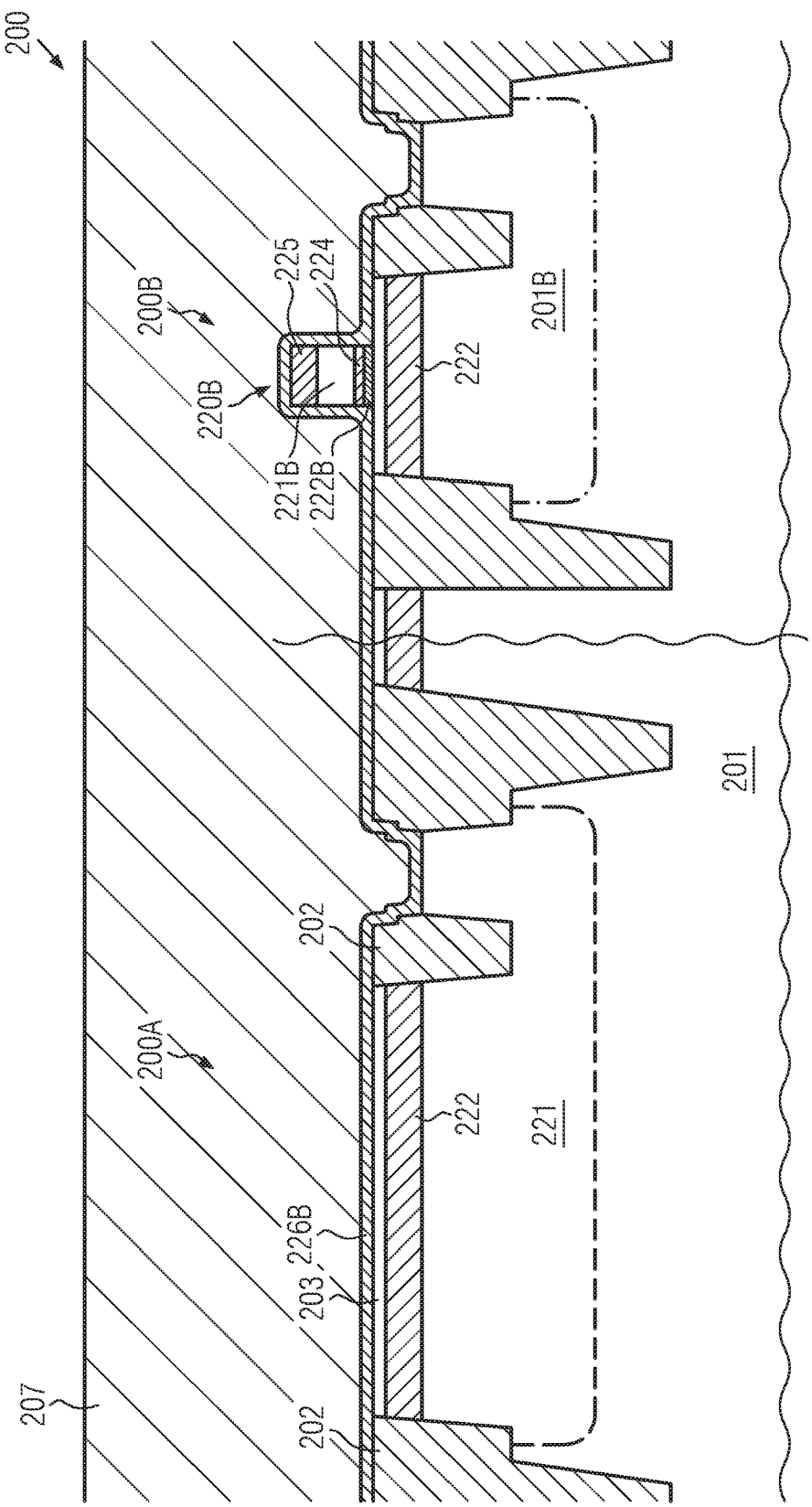

HIGH VOLTAGE TRANSISTOR USING BURIED INSULATING LAYER AS GATE DIELECTRIC

BACKGROUND

1. Field of the Disclosure

Generally, the present disclosure relates to semiconductor devices and manufacturing techniques for providing transistor elements formed on the basis of a semiconductor or silicon-on-insulator (SOI) architecture.

2. Description of the Related Art

Significant progress has been made in the field of semiconductor devices due to the continuous reduction of critical dimensions of field effect transistors. In recent developments, critical dimensions of the transistor elements have reached 30 nm and even less in sophisticated planar device architectures, thereby achieving extremely high integration density and, therefore, providing the possibility of integrating more and more functions into a single integrated circuit. The continuous reduction of critical dimensions of sophisticated field effect transistors, such as the gate length, is typically associated with certain challenges that must be addressed in order to achieve appropriate function of field effect transistors of reduced dimensions. Some of these adverse side effects of the continuous reduction of the gate length of sophisticated field effect transistors are associated with the capacitive coupling between the conductive channel forming below the gate electrode structure, the parasitic capacitance of the remaining transistor body with respect to the gate electrode structure, thereby increasing static and dynamic leakage currents into and through a very thin gate dielectric material, and the like. For example, the problem of a reduced capacitive coupling of the gate electrode structure to the channel region has resulted in a continuous reduction of the physical thickness of the gate dielectric material for increasing the capacitive coupling, which, on the other hand, may significantly contribute to increased leakage currents into and through the thin gate dielectric material. Therefore, sophisticated material systems and manufacturing techniques have been developed in order to introduce high-k dielectric materials into the gate dielectric material, thereby obtaining a physical thickness that may be appropriate for maintaining leakage currents at an acceptable level, while further reducing the resulting electrical thickness or oxide equivalent thickness.

In an attempt to further enhance overall controllability of the channel region of highly scaled field effect transistors, the problem of unavoidable dopant fluctuations in channel regions of a length of approximately 30 nm and significantly less may be addressed in recent developments by further reducing the dopant concentration in the channel region, thereby also reducing the probability of scattering events and, thus, increasing overall speed of charge carriers in the channel region. In this context, it has been recognized that a fully depleted transistor body region, i.e., the channel region and any region in the vicinity thereof does not substantially contain mobile charge carriers at 0 V applied to the gate electrode structure, may provide superior transistor performance, particularly in view of overall channel controllability. A fully depleted transistor configuration may be obtained by using a very thin semiconductor material for implementing therein the channel region, such as a very thin silicon material, a silicon/germanium material and the like, so that, in combination with no or very low dopant concentration in this extremely thin semiconductor material, the desired fully depleted state is obtained.

Moreover, in at least some aspects, transistor performance may also be increased by using an SOI architecture, i.e., an architecture in which a buried insulating material is formed below the respective active semiconductor material. Consequently, sophisticated circuit designs have been developed on the basis of fully depleted planar transistor elements formed on the basis of an SOI architecture, wherein, even for highly sophisticated transistor elements with critical dimensions of 30 nm and significantly less, moderately high switching speed of the transistors may be achieved in combination with a moderately low power consumption. As a consequence, even highly complex control circuitry may be implemented into a respective circuit design, wherein, due to the moderately low power consumption, even complex stand-alone devices may be provided with any such complex circuitry.

Since the fully depleted transistor configuration in planar transistor architecture basically provides for the implementation of highly complex circuitry into a single semiconductor chip, there is also a demand for transistor elements operating at higher voltages compared to the sophisticated fully depleted transistor elements used for small signal applications. That is, these sophisticated small signal transistors are typically operated at a supply voltage of approximately 2 V and even less in order to reduce static and dynamic leakage currents and, thus, power consumption, thereby also providing the possibility of reducing the physical thickness of respective gate dielectric materials, which may be required, as discussed above, in order to preserve a desired degree of channel controllability, even if sophisticated high-k dielectric materials are used. Consequently, when implementing additional functions into an integrated circuit chip, for instance, radio frequency (RF) components with respective output stages, charge pumps or any other power devices which may have to be operated at significantly higher voltages of approximately 5V and significantly higher, such as 10-50V and higher, respective high voltage transistors have to be implemented at certain device areas of respective integrated circuit chips. Although respective high voltage transistors may be basically formed on separate substrates in accordance with separate manufacturing strategies and may be subsequently transferred to a further substrate carrying thereon sophisticated small signal transistor elements, it turns out that such process strategies may still contribute significantly to overall manufacturing costs and may, therefore, render such approaches less than desirable.

In still other approaches, respective high voltage transistor elements may be formed, together with sophisticated small signal transistors, thereby, however, requiring significant modifications so as to comply with the requirements for forming a reliable high voltage transistor. For example, the patterning of the respective gate electrode structures may have to be performed on the basis of different strategies, since, except for different gate lengths of sophisticated small signal transistors and high voltage transistors, in particular, a significantly increased physical thickness of the gate dielectric material is required for the high voltage transistors. Therefore, the patterning of the gate dielectric material may have to be performed in at least two different sequences so as to provide the typically used high-k dielectric material stack for the sophisticated small signal transistors and a corresponding high voltage gate dielectric material, such as a silicon dioxide material, with sufficient physical thickness so as to comply with the voltage requirements of the high voltage transistor. Therefore, great efforts have been made in order to implement a fully depleted transistor architecture for a high voltage transistor or to attempt to use the specific architecture of an SOI device for implementing a corresponding high voltage transistor, for instance, by using the buried insulating material as a gate dielectric layer.

U.S. Pat. No. 7,939,395, for instance, describes a semiconductor device in which the buried insulating layer may be used as a gate dielectric material, wherein a gate electrode is formed in the "active" semiconductor layer above the buried insulating layer, and the drain and source regions are formed in the silicon substrate material. To this end, a first contact region is formed so as to extend through the buried silicon dioxide layer and connect to the highly doped drain region, while a second contact region is formed through the buried insulating layer and connects to the highly doped source region.

U.S. Pat. No. 7,745,879 relates to a fully depleted silicon-on-insulator field effect transistor based on SOI architecture and a corresponding manufacturing technique in which a thin silicon layer may be used for providing a drain region including a lightly doped area, which may be considered as a drift region providing a substantial length for allowing a respective voltage drop. Furthermore, a channel region is positioned between the drift region and the source region, and a gate electrode structure of appropriate configuration, i.e., having an appropriately dimensioned gate dielectric material, is positioned above the channel region and also connects to a carrier recombination element.

U.S. Pat. No. 7,151,303 relates to an access transistor for memory devices that has superior robustness with respect to radiation or particle-induced charge carrier generation, wherein a fully depleted state may be obtained by providing specifically doped gate electrodes. That is, in this concept, a gate electrode material of inverse doping compared to the drain and source dopings may be used in order to obtain a fully depleted state in the channel region.

Due to the significant efforts invested in providing high voltage transistors in an SOI configuration, it turns out that significant modifications may, nevertheless, have to be implemented compared to well-established process flows for forming sophisticated fully depleted small signal transistors, thereby adding significant additional costs to such devices formed in accordance with known strategies.

In view of the situation described above, the present disclosure, therefore, relates to semiconductor devices and manufacturing techniques in which field effect transistors on the basis of an SOI architecture may be provided, possibly in accordance with a fully depleted transistor configuration, while avoiding or at least reducing the effects of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is based on the concept that the buried insulating layer of a semiconductor device may be advantageously used as a gate dielectric material, wherein any substrate or bulk material formed below the buried insulating material may be efficiently used as a gate electrode material. Consequently, in such a device configuration, a "standard" gate electrode structure formed above a respective semiconductor material may no longer be required.

In some aspects disclosed herein, the semiconductor layer formed above the buried insulating layer, which may serve as the gate dielectric material, may be provided with a thickness that is appropriate for obtaining a fully depleted state in the channel region, thereby providing the advantages associated with a fully depleted transistor configuration, such as reduced parasitic capacitance, superior controllability of the channel region, high charge carrier mobility due to a reduced number of scattering centers, a general reduction of dopant fluctuations when reduced transistor lengths are considered and the like. Moreover, by using a very thin initial semiconductor layer as may, for instance, also be used for sophisticated fully depleted small signal transistor elements, a high degree of compatibility with respect to process techniques may be achieved, resulting in reduced overall manufacturing costs.

Furthermore, when forming such fully depleted transistor elements in combination with fully depleted small signal transistor elements within a single semiconductor chip, a significant increase of overall functionality may be obtained, since, in particular, the relatively thick buried insulating material may provide an increased physical thickness of the gate dielectric material, which may, therefore, allow operation of any such transistor elements at elevated supply voltages. Consequently, respective circuit portions requiring transistors with high operating voltage may be formed on the basis of a fully depleted transistor architecture with high compatibility with respect to configuration and manufacturing flow to fully depleted small signal transistors. Consequently, superior design flexibility in combination with enhanced functionality at increased integration density may be achieved, since any such high voltage transistor elements may be implemented at any desired device area, thereby possibly enabling the formation of small signal transistors and high voltage transistors in adjacent device areas.

According to one illustrative embodiment disclosed herein, a semiconductor device includes a channel region in a semiconductor layer. Moreover, drain and source regions are positioned on the semiconductor layer so as to laterally connect to the channel region. The semiconductor device further includes a buried insulating layer including a portion positioned below the channel region. Additionally, the semiconductor device includes a doped region positioned below the buried insulating layer that is connected to a gate contact region, wherein the portion of the buried insulating layer and the doped region form a gate electrode structure of a transistor element.

According to a further illustrative embodiment disclosed herein, a transistor element includes a channel region positioned between a drain region and a source region. Moreover, the transistor element includes a portion of a buried insulating layer that is positioned below at least the channel region. Additionally, the transistor element includes a doped semiconductor region positioned below the portion of the buried insulating layer and connected to a control terminal, wherein the portion of the buried insulating layer and the doped semiconductor region form a gate electrode structure.

According to a still further illustrative embodiment disclosed herein, a method is provided. The method includes forming a gate electrode structure of a transistor element by doping a portion of a substrate material of a semiconductor substrate below a portion of a buried insulating layer. The method further includes forming a drain region and a source region on a semiconductor layer that is formed on the buried insulating layer. Additionally, the method includes forming an interlayer dielectric material between the drain region and the source region.

BRIEF DESCRIPTION OF THE DRAWINGS

The disclosure may be understood by reference to the following description taken in conjunction with the accompanying drawings, in which like reference numerals identify like elements, and in which:

FIGS. 2A-2L schematically illustrate cross-sectional views of a semiconductor device during various manufacturing stages, in which a transistor element may be formed on the basis of a gate electrode structure formed by a buried insulating material and a substrate material positioned below the same, and sophisticated small signal transistors may be formed on the basis of a manufacturing flow with high process compatibility.

Figure 1A:
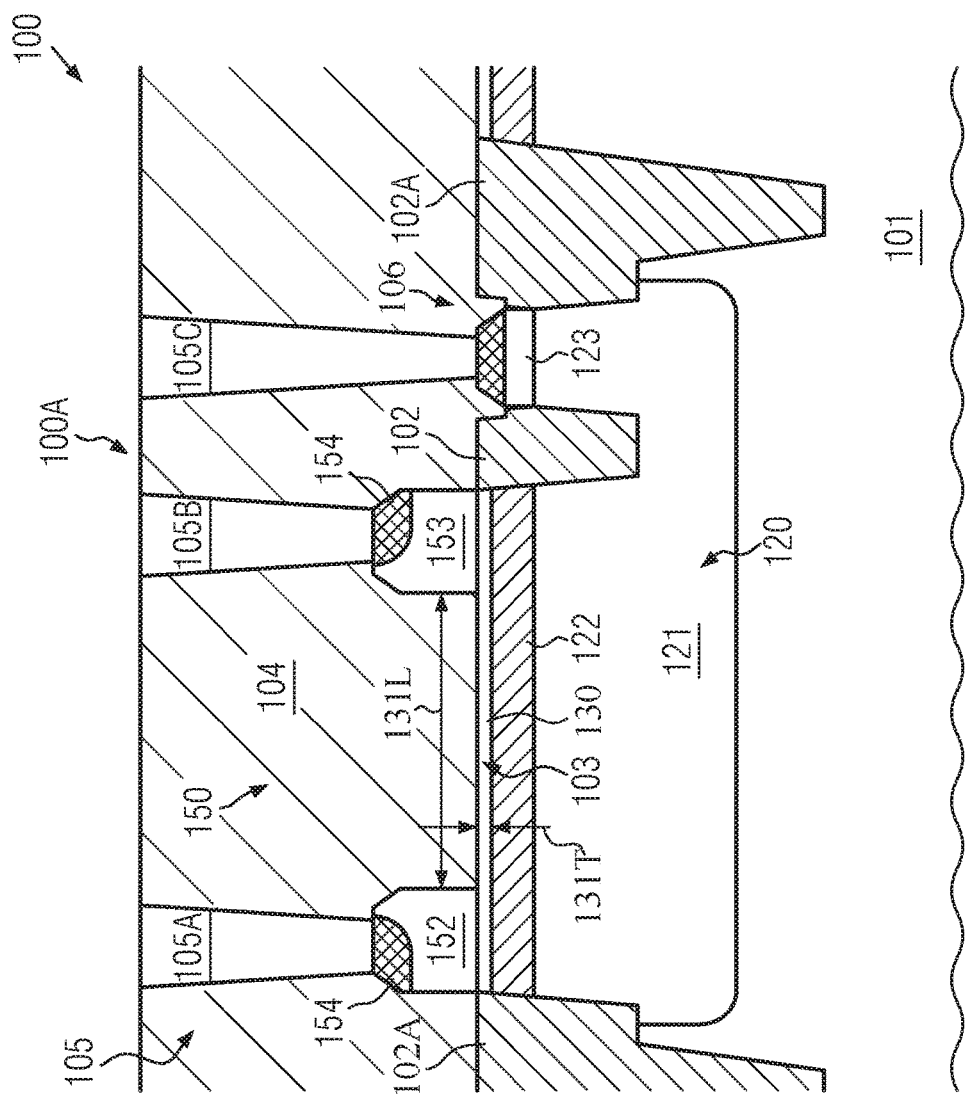
FIGS. 1A and 1B schematically illustrate a cross-sectional view and a top view, respectively, of a transistor element having a gate electrode structure formed on the basis of a buried insulating material and an electrode material positioned below the buried insulating layer, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure is based on the concept that field effect transistors, which may require an increased physical thickness of the gate dielectric material, may be formed on the basis of a buried insulating layer portion of an SOI device in order to avoid any substantial additional processes and material systems that may be typically associated with the formation of gate dielectric materials of different material composition and/or different thickness. Furthermore, it has been recognized that a high degree of compatibility with many existing CMOS process strategies may be preserved by using the substrate material or bulk material positioned below the buried insulating layer as gate electrode material so that, in some illustrative embodiments, the entire control regime for operating a respective transistor element may be provided as a "buried" gate electrode structure, which may also be referred to as a back gate electrode structure, wherein the implementation of the buried gate electrode structure may be accomplished with reduced overall process complexity. In some illustrative embodiments, a high degree of compatibility with sophisticated process techniques as applied for forming fully depleted SOI transistor elements for small signal or low power applications may be achieved, for instance, by using a moderately thin semiconductor material in combination with the corresponding buried insulating layer in and above which respective "standard" sophisticated field effect transistors may be formed. In some illustrative embodiments, the transistor elements using the buried insulating layer as the gate dielectric material, herein also referred to as high voltage transistor elements due to the moderately thick gate dielectric material, may be formed together with the low power or small signal transistor elements within the same semiconductor chip, thereby providing for the possibility of integrating extended functionality to sophisticated SOI devices formed on the basis of fully depleted transistor elements. In other cases, respective high voltage transistor elements may be formed in any type of circuitry, with or without any additional small signal transistors, depending on the overall circuit and device requirements.

FIG. 1A schematically illustrates a cross-sectional view of a semiconductor device 100 including a transistor element, also referred to as high voltage transistor 150 according to illustrative embodiments. The semiconductor device 100 may comprise a substrate 101, which may be provided in the form of any appropriate crystalline semiconductor material, such as silicon, silicon/germanium, germanium and the like. It should be appreciated that the majority of complex integrated circuits are presently fabricated on the basis of silicon substrates due to cost considerations and due to the very matured process techniques available in the context of silicon substrates. In the sense used herein, the substrate material or substrate 101 is to be understood as a crystalline semiconductor material which may represent a substrate or carrier for forming therein and thereon respective semiconductor devices, while, in other cases, the substrate 101 may merely represent an upper portion of any other appropriate carrier material. In this case, the substrate material 101 may, for instance, be provided in the form of a semiconductor layer having a specific thickness of 1 µm or more. It should be further appreciated that the substrate 101 may be laterally divided, that is, in the horizontal direction and in the direction perpendicular to the drawing plane of FIG. 1A, into specific device regions or areas, depending on the overall configuration of the semiconductor device 100.

For example, the transistor element 150 as illustrated may be positioned in a device region in which a plurality of respective high voltage transistor elements may be required, without having incorporated therein any other transistor elements, such as low power transistors and the like. In other cases, the transistor 150 may be formed in combination with low power transistors within a respective transistor area so as to establish a desired functional behavior of at least a portion of the semiconductor device 100. In other cases, the functional behavior of a certain device area of the semiconductor device 100 may be obtained on the basis of the plurality of the transistors 150, while, in other separate areas of the semiconductor device 100, a different type of functional behavior may be implemented without requiring the provision of one or more of the transistors 150.

The semiconductor device 100 may further comprise isolation structures 102, 102A formed so as to laterally delineate respective areas, such as transistor areas and the like. For instance, the isolation structures 102 may be provided in the form of shallow trench isolations, which may or may not extend into the substrate region 101, i.e., as shallow trenches filled with any appropriate dielectric material, such as silicon dioxide, silicon nitride, and the like. In combination with the shallow isolation structures 102, in some illustrative embodiments, the "deep" isolation structures 102A may be provided so as to obtain superior lateral isolation of respective doped regions formed in an upper portion of the substrate material 101 in accordance with overall device requirements. In this respect, it should be noted that the "deep" isolation structures 102A may extend into the substrate material 101 with a depth of approximately 50 nm and more, such as 200 nm, but may not exceed a depth of several hundred nanometers or the like.

Moreover, the semiconductor device 100 may comprise a buried insulating layer 122, which may represent a portion of a buried insulating material, which may have been initially provided across the entire substrate 101 and which may have been patterned in compliance with design requirements. In other cases, the buried insulating layer 122 may be basically provided in certain device regions in which an SOI architecture is required, while, in other device areas, a "bulk" configuration may have to be implemented. It should be understood that the configuration as shown in the context of the transistor 150 may be considered as a hybrid configuration, since the buried insulating layer 122 may be positioned below an active semiconductor layer 103, while in an area 106, the buried insulating layer 122 may be removed, thereby providing direct access to an upper portion of the substrate material 101. Typically, the "deep" isolations structures 102A may delineate this "hybrid" region.

The semiconductor layer 103, for instance, provided in the form of silicon, silicon/germanium and the like, may have an appropriate thickness and dopant concentration as required for an appropriate operational behavior of the transistor 150. In some illustrative embodiments, the semiconductor layer 103 may be provided with a thickness, material composition and/or dopant concentration so as to support a fully depleted transistor configuration. In this case, in some illustrative embodiments, a thickness of the semiconductor layer 103, as indicated by 131T, at least at a channel region 130 formed therein, may be approximately 15 nm or less. It is well known that, in many sophisticated semiconductor devices, a respective thickness of the active semiconductor material, such as 15 nm and less, or even 10 nm and less, may be used in order to form sophisticated fully depleted SOI transistor elements with a gate length of 30 nm and less. Furthermore, a source region 152 and a drain region 153 in the form of a highly doped semiconductor material are formed on end portions of the semiconductor layer 103, thereby laterally delineating the channel region 130. Consequently, the source and drain regions 152, 153 define a channel length 131L, in which a conductive channel may form upon specific conditions for operating the transistor 150. The channel length 131L, which may substantially correspond to a gate length of a "standard" transistor element, may be selected in accordance with overall device requirements, for instance, with respect to a desired voltage drop along the channel region 130 when operating the transistor 150 on the basis of a desired supply voltage.

Control of the conductivity in the channel region 130 may be accomplished on the basis of a "buried" gate electrode structure 120, which may comprise the buried insulating layer 122 formed below the semiconductor layer 103, an electrode material in the form of a doped semiconductor region 121, which may represent a specific portion of the substrate material 101, and a gate contact region 123, which may be provided in the form of a highly doped semiconductor material and which may have a configuration, with respect to material composition and dopant concentration, similar to the drain and source regions 153, 152. For example, for an N-type transistor, the drain and source regions 153, 152 may include a moderately high dopant concentration of an N-type dopant species and also the contact region 123 may have a moderately high dopant concentration of an N-type species so as to connect to the doped region 121, which may have a moderately high, yet, in some illustrative embodiments, reduced, N-type dopant concentration compared to the contact region 123. It should be appreciated, however, that the doping regime in the gate electrode structure 120 may be selected in accordance with other criteria, for instance, with respect to adjusting the threshold voltage of the transistor 150 and the like and, hence, for an N-type transistor, even a P-doped species may be incorporated into the semiconductor region 121 and, thus, in the contact region 123, if considered appropriate with respect to a desired operational behavior of the transistor 150. Furthermore, for a P-type transistor element, the respective dopings, as discussed above, may be inverted so that, if required, both N-type and P-type transistors having the basic geometric configuration of the transistor 150, may be provided in the semiconductor device 100, if required.

In the manufacturing stage shown in FIG. 1A, the semiconductor device 100 may further comprise highly conductive metal semiconductor compounds 154, such as nickel silicide regions, so as to further reduce contact resistance of any semiconductor regions in which the metal semiconductor compounds 154 may be implemented. As shown, the metal semiconductor compounds 154 may be formed at outer upper portions of the drain and source regions 153, 152 and an upper portion of the contact region 123. In this manner, contact resistance to respective contact elements 105A, 105B and 105C may be reduced. The contact elements 105A, 105B, 105C in combination with one or more dielectric materials 104 may represent a contact level 105 of the semiconductor device 100, which may, thus, provide contact to any circuit elements formed at the semiconductor level, while additional metallization layers (not shown) may provide electrical contact to the respective contact elements in the contact level 105 in accordance with overall circuit design.

Figure 1B:
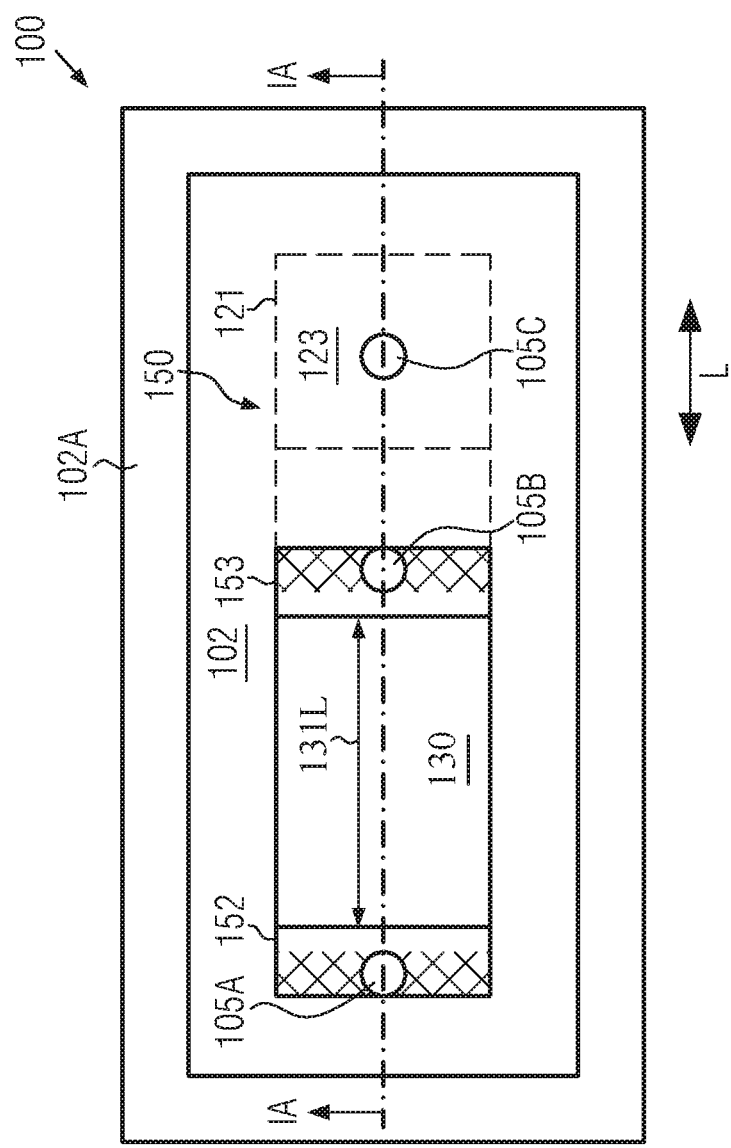

FIG. 1B schematically illustrates a top view of the semiconductor device 100, wherein the line IA represents the cross-section as illustrated in FIG. 1A. As shown, the transistor 150 is laterally embedded in the shallow isolation structure 102, which, in turn, is surrounded by the "deep" isolation structure 102A. Furthermore, the channel region 130 and the drain and source regions 153, 152 in combination with the contact region 123 are schematically illustrated, wherein, for convenience, it may be assumed that the contact level 105 is not present or is transparent, wherein, however, the contact elements 105A, 105B, 105C are, nevertheless, indicated in this drawing. Moreover, for convenience, the doped semiconductor region, i.e., the gate electrode material 121, is illustrated in dashed lines, since this region is covered by the isolation structures 102, the channel region 130, the drain and source regions 153, 152 and the contact region 123, as is also illustrated in FIG. 1A. Furthermore, as illustrated, the channel length 131L extends along a length direction L of the transistor 150, while the drain and source regions 153, 152 extend along a transistor width direction, i.e., in FIG. 1B the vertical direction. As discussed above, specific transistor characteristics may be adjusted on the basis of the geometry for otherwise given parameters, such as thickness of the semiconductor layer 103 and, thus, of the channel region 130 (see FIG. 1A), dopant concentration therein, thickness of the "gate dielectric," i.e., the buried insulating layer 122, the channel length 131L and the respective width of the transistor 150. Consequently, upon applying a specific supply voltage to the source region 152 and the drain region 153, which may be selected significantly higher compared to low power transistors, which may be formed on the basis of sophisticated gate electrode structures with a physical thickness of a corresponding gate dielectric of approximately 10 nm and significantly less, a conductive channel forms in the channel region 130 between the source region 152 and the drain region 153, when an appropriate control voltage is applied to the contact region 123.

The semiconductor device 100 as shown in FIGS. 1A and 1B may be formed in accordance with manufacturing techniques as will be described later on in more detail with reference to FIGS. 2A-2M.

Figure 1C:
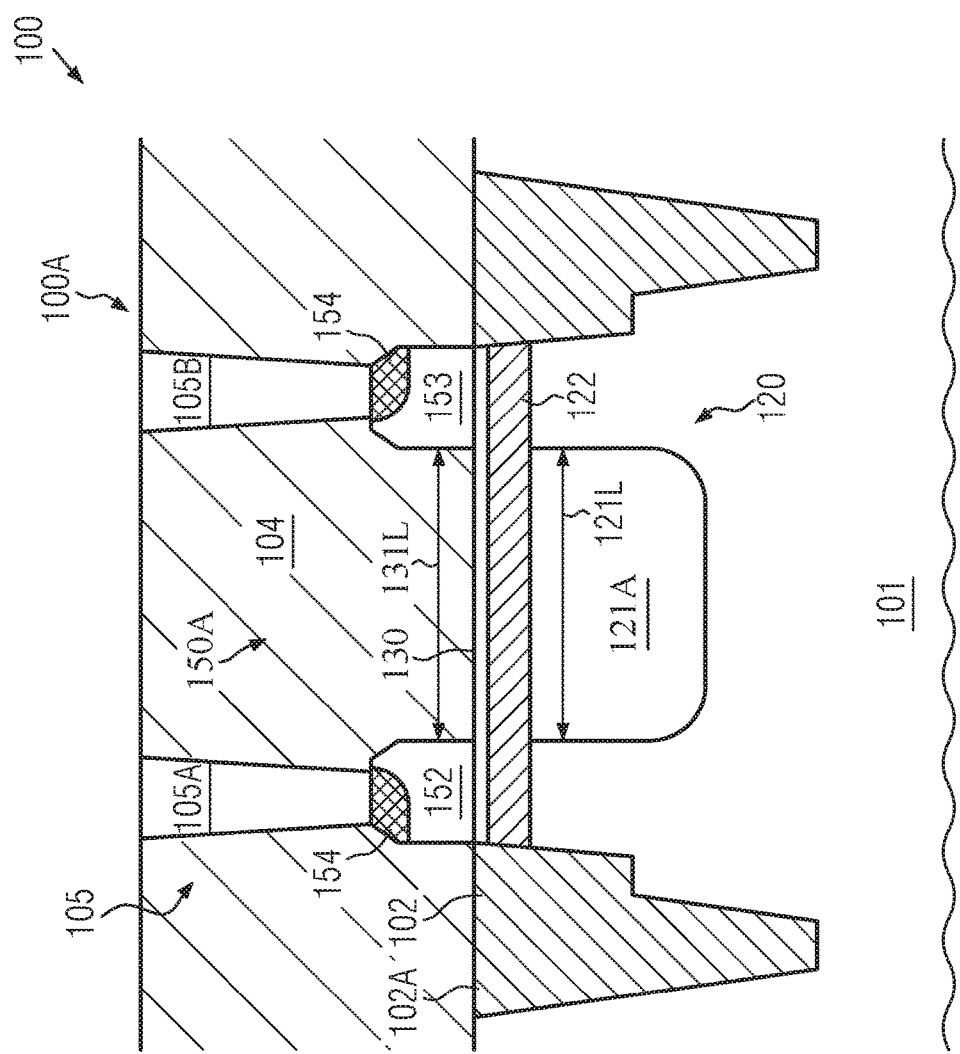
FIGS. 1C and 1D schematically illustrate a cross-sectional view and a top view, respectively, of a further transistor element including a gate electrode structure formed on the basis of a buried insulating material and a doped substrate material formed below the buried insulating layer, wherein reduced parasitic capacitance is obtained compared to the transistor element of FIGS. 1A and 1B.

FIG. 1C schematically illustrates a cross-sectional view of the semiconductor device 100 comprising a transistor 150A having a modified configuration compared to the transistor 150 of FIGS. 1A and 1B. In this illustrative embodiment, the transistor 150A may basically have the same configuration, except for a reduced gate/drain and gate/source capacitance compared to the transistor 150 of FIGS. 1A and 1B. To this end, a doped semiconductor region 121A, acting as gate electrode material, may be formed so as to extend in the transistor length direction, i.e., in FIG. 1C the horizontal direction, so as to substantially correspond to the channel region 130, i.e., defining a gate length 121L, which substantially corresponds to the channel length 131L. That is, the doped semiconductor region 121A is embedded in the substrate material 101 so as to be offset from the delineating isolation structures 102 by a distance that substantially corresponds to the lateral extension of the drain and source regions 153, 152 along the transistor length direction. On the other hand, as shown in FIG. 1A, the doped semiconductor region 121 of the transistor 150 is laterally delineated by the isolation structures 102, at least in the vicinity of the buried insulating layer 122. Consequently, the transistor 150A of FIG. 1C may have a reduced parasitic capacitance compared to the configuration of the transistor 150 of FIGS. 1A and 1B, thereby achieving increased switching speed.

Figure 1D:
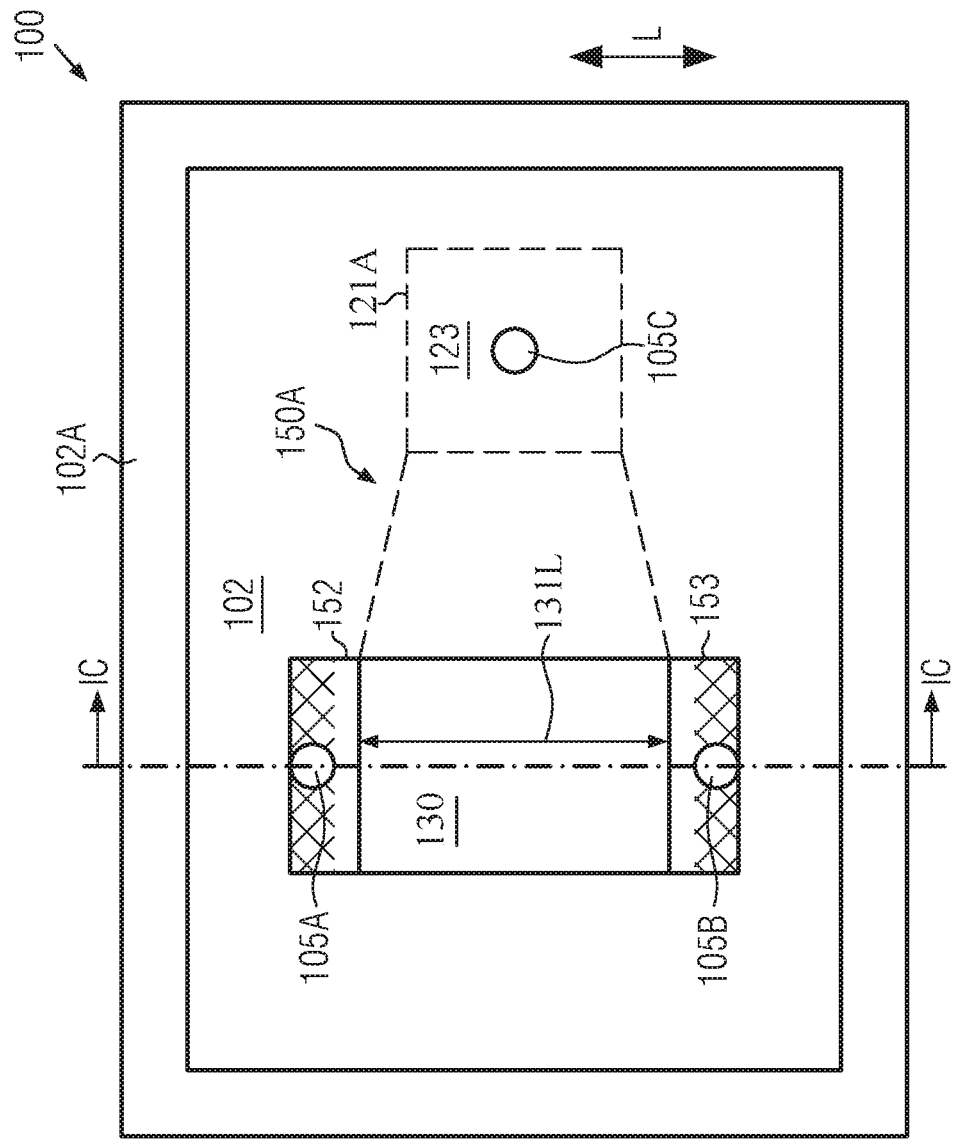

FIG. 1D schematically illustrates a top view of the semiconductor device 100 of FIG. 1C, wherein the line IC indicates the cross-section taken for illustrating FIG. 1C. Furthermore, as shown, the channel length 131L extends along the transistor length direction, which is now the vertical direction L in FIG. 1D. On the other hand, the doping of the region 121A is established such that, at least along the transistor length direction L, the gate electrode material 121A is positioned below the channel region 130, substantially without extending into the drain and source regions 153, 152, as discussed above with reference to FIG. 1C. Consequently, upon applying a respective supply voltage and an appropriate control voltage to the transistor 150A, for otherwise the same geometry, i.e., the same transistor length and transistor width compared to the device of FIGS. 1A and 1B, a somewhat increased switching speed may be obtained.

The transistor 150A of the device 100 as shown in FIGS. 1C and 1D may be formed in accordance with manufacturing techniques as will be discussed later on with reference to FIGS. 2A-2M.

Furthermore, the transistors 150, 150A as shown in FIGS. 1A and 1C may be provided without a specific device structure between the respective drain and source regions 153, 152. That is, in these illustrative embodiments, the one or more interlayer dielectric materials 104 of the contact level 105 may be formed so as to continuously extend between the drain region 153 and the source region 152 without any additional transistor relevant structures. In other illustrative embodiments, as will be discussed later on, one or more additional components, such as one or more material layers for adjusting transistor characteristics, a dummy gate electrode, possibly in combination with parameter adjusting materials, and the like, may be formed on or above the channel region 130 or a portion thereof, as considered appropriate for the overall device configuration.

With reference to FIGS. 2A-2M, further illustrative embodiments will now be described, wherein process techniques are referred to for forming a transistor element on the basis of a gate electrode structure, including the buried insulating layer and a doped semiconductor region formed below the buried insulating layer, as, for instance, discussed above with reference to FIGS. 1A-1D.

Figure 2A:
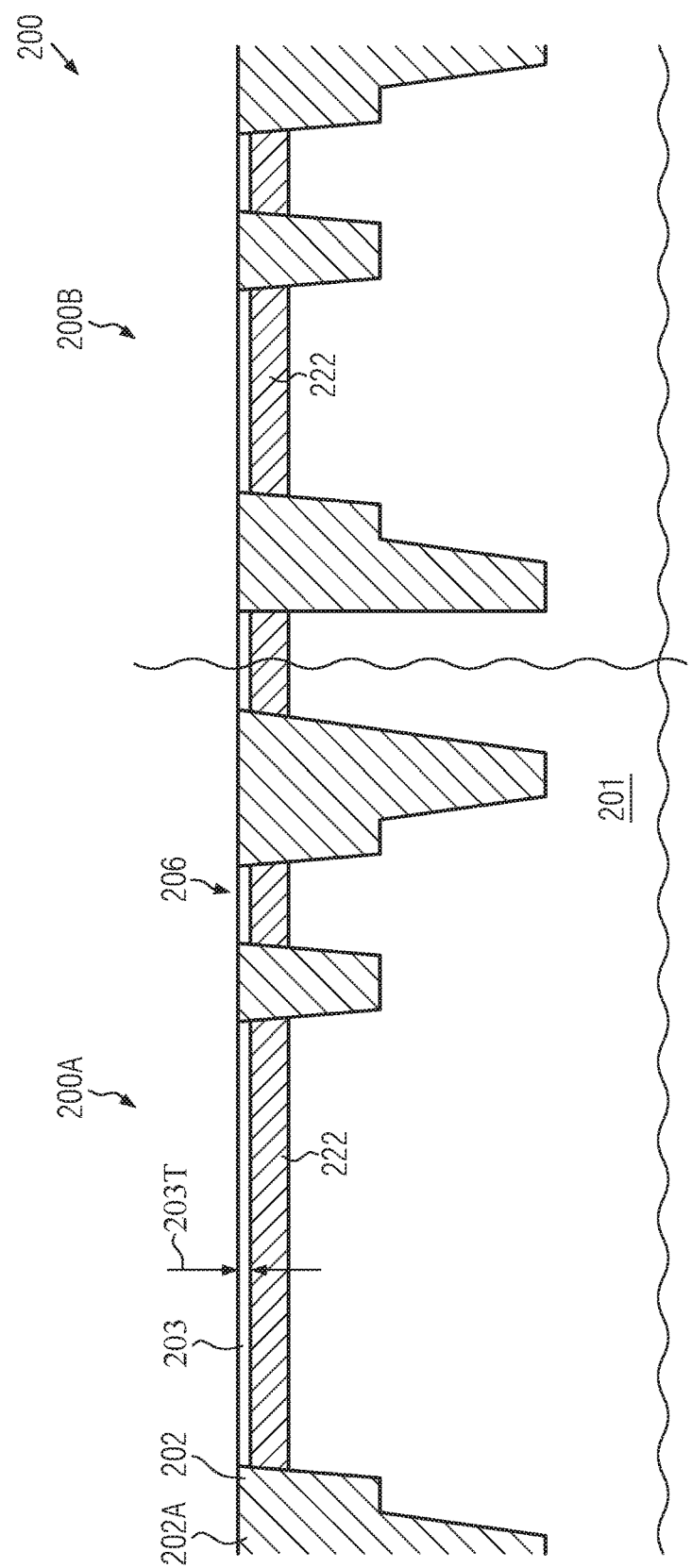

FIG. 2A schematically illustrates a cross-sectional view of a semiconductor device 200 comprising a first device region 200A and a second device region 200B. In the first device region 200A, a transistor may be formed, such as the transistor 150 previously described with reference to FIGS. 1A-1D or any other transistor of similar configuration in which a buried gate electrode structure is to be implemented. The second device region 200B may represent a portion of the semiconductor device 200 in and above which small signal or low power transistors may be formed. Thus, in some illustrative embodiments, low power transistors and high voltage transistor elements, including a buried gate electrode structure, may be formed in a common process flow within the same semiconductor device 200.

In the manufacturing stage shown, the semiconductor device 200 may comprise a substrate material 201, such as any appropriate crystalline semiconductor material, such as a silicon material and the like, as is also discussed above with reference to the substrate material 101 of the semiconductor device 100 of FIGS. 1A-1D. Furthermore, a buried insulating layer 222 may be formed in the first and second device regions 200A, 200B and may comprise any appropriate dielectric material, such as silicon dioxide, silicon nitride, a high-k dielectric material, if considered appropriate, or any other material that may be considered appropriate for providing sufficient physical thickness so as to ensure proper electrical isolation of the substrate material 201 with respect to a semiconductor layer 203 that is formed on the buried insulating layer 222. For example, in some illustrative embodiments, the buried insulating layer 222 may have a thickness of approximately 10 nm or greater. For instance, in some well-established CMOS process techniques for forming fully depleted SOI low power transistors, the buried insulating layer provided therein may have a thickness of approximately 20 nm. The semiconductor layer 203 in its initial state may represent any appropriate semiconductor material, such as silicon, silicon/germanium, silicon/carbon and the like, depending on the specific requirements for transistor elements to be formed on the basis of the semiconductor layer 203. In some illustrative embodiments, an initial thickness 203T of the semiconductor layer 203 may be 15 nm and less. Furthermore, it should be appreciated that any aspects previously discussed in the context of the semiconductor layer 103 of the semiconductor device 100 may also apply to the semiconductor layer 203, if appropriate.

Furthermore, isolation structures 202, 202A may be provided so as to laterally delineate respective areas in the first and second device regions 200A, 200B. For instance, the relatively shallow isolation structures 202 may laterally delineate respective transistor areas, i.e., current flow areas, while the relatively deep trench isolation structures 202A may enclose an area representing a "hybrid" area, such as the area 206, in which the buried insulating layer 222 may be removed in a later manufacturing stage so as to provide a direct connection to a portion of the substrate material 201.

The semiconductor device 200 as shown in FIG. 2A may be formed on the basis of the following processes. After providing the substrate 201, which may already include the buried insulating layer 222 and the initial semiconductor layer 203, the characteristics of which may further be adjusted, if required, for instance, in view of material composition, initial thickness, dopant concentration and the like, wherein any such modifications may be performed locally or globally in the semiconductor device 200 as required, a process sequence may be applied so as to form the isolation structures 202, 202A. To this end, well-established oxidation, deposition and lithography techniques may be applied, followed by respective etch sequences so as to form trenches in the semiconductor layer 203 and the buried insulating layer 222, which may extend into the substrate material 201 with a specified depth. Thereafter, appropriate dielectric material or materials may be deposited and may be subsequently planarized by well-established process techniques. It should be appreciated that, even after the corresponding process sequence, one or more protective layers (not shown) may still cover the semiconductor layer 203, if required. Moreover, as already discussed, prior to or after forming the trench isolation structures 202, 202A, a respective processing may be performed so as to adjust an initial thickness of the semiconductor layer 203 to any desired value, wherein, for instance, the thickness 203T of the layer 203 in the first semiconductor region 200A may be adjusted to a greater thickness compared to the thickness of the semiconductor layer 203 in the second device region 200B, in which low power transistors may have to be formed. Similarly, other material characteristics, such as initial dopant concentration, if a non-intrinsic semiconductor material is to be used, general material composition and the like, may be appropriately adjusted on the basis of respective masking techniques and processes, such as implantation, epitaxial growth, etch processes and the like.

Figure 2B:
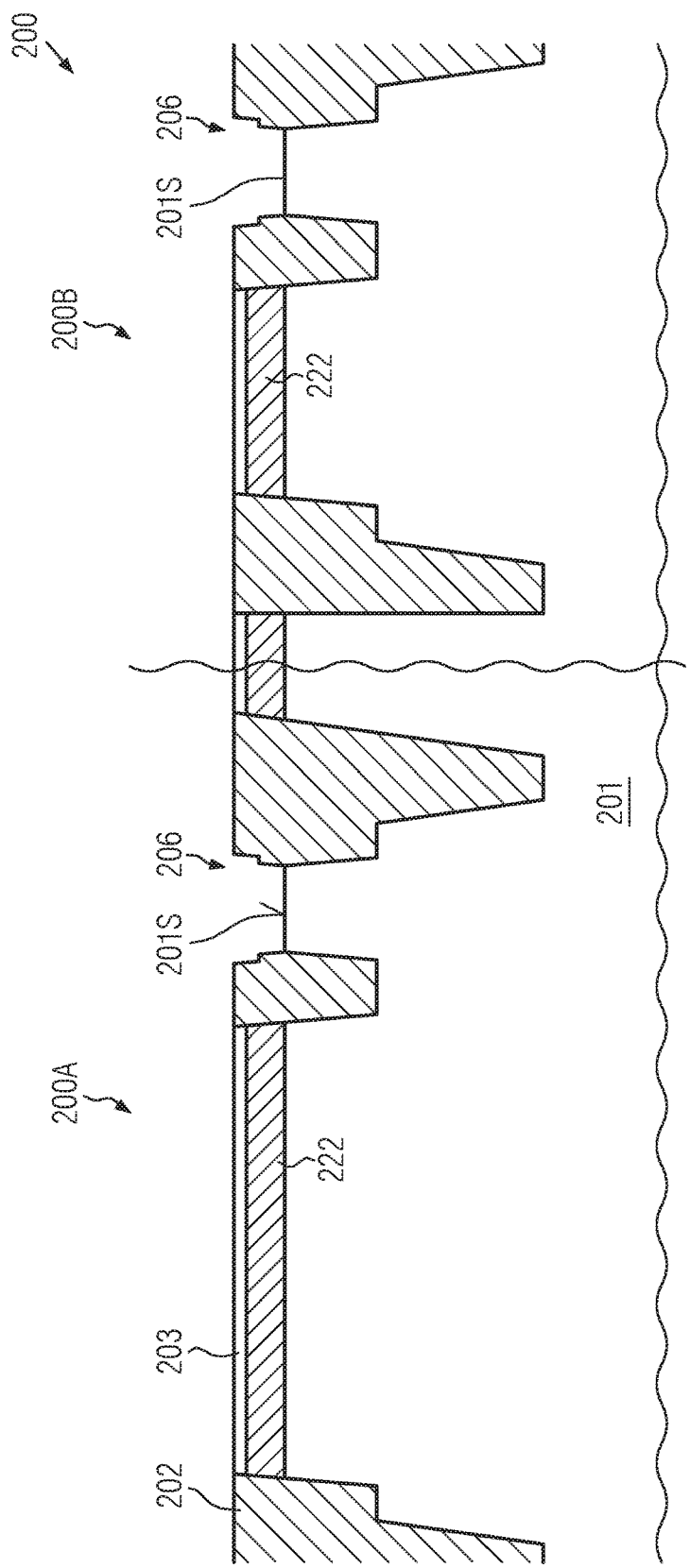

FIG. 2B schematically illustrates a cross-sectional view of the semiconductor device 200 in a further advanced manufacturing stage. As shown, in the respective regions 206, the initial semiconductor layer 203 and the buried insulating layer 222 may be removed, thereby exposing a surface 201S of the substrate material 201 of the respective hybrid areas in the first and second device regions 200A, 200B. To this end, an appropriate masking process may be performed by using lithography and deposition techniques, followed by etch processes so as to etch through the materials 203, 222. Thereafter, any etch mask may be removed. Also in this case, any protective layer or layers may still be present on the semiconductor layer 203, as considered appropriate. In other cases, after forming the opening in the regions 206 for exposing the surface 201S, a further protective layer or screening layer may be formed, if considered appropriate. To this end, any well-established deposition and/or oxidation recipes are available.

Figure 2C:
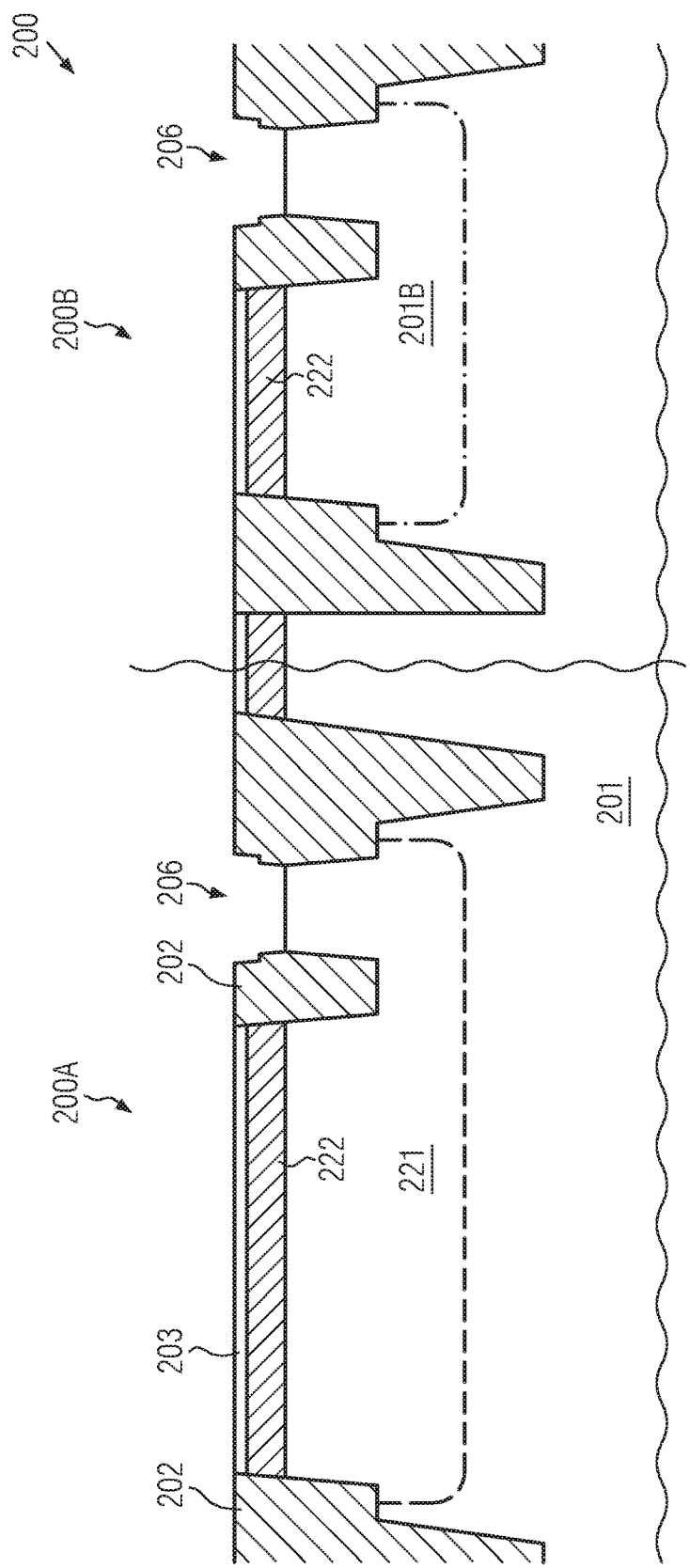

FIG. 2C schematically illustrates a cross-sectional view of the semiconductor device 200 in a manufacturing stage in which a doped semiconductor region 221 may be formed at least below the buried insulating layer 222 in the first device region 200A. Similarly, a doped region 201B may be formed in the second device region 200B. In the embodiment shown in FIG. 2C, it is assumed that, in the first device region 200A, the overall geometry of a transistor element still to be formed is equivalent to the geometry as shown in FIG. 1B, so that the doped semiconductor region 221 may laterally extend along the entire length direction of the buried insulating layer 222 and is laterally delineated by the isolation structures 202. In other illustrative embodiments (not shown), the doped semiconductor region 221 may correspond to the geometric configuration as shown in FIG. 1D, so that, along a transistor length direction, the doped semiconductor region 221 may extend along a portion of the buried insulating layer 222 with a lateral offset with respect to the isolation structures 202, as, for instance, shown in FIG. 1C with respect to the doped semiconductor region 121A.

The doped semiconductor region 221 may represent the electrode material of a gate electrode structure constituted by the buried insulating layer 222 or the portion of this layer positioned between the respective isolation structures 202 in the first device region 200A and a contact region still to be formed in the area 206 of the first semiconductor region 200A, as is also previously discussed with reference to the semiconductor device 100. To this end, the dopant species introduced into the region 221 may be provided with any appropriate profile so as to comply with the requirements of threshold adjustment, overall conductivity and the like. For instance, a moderately high concentration of an N-type dopant species may be incorporated, while, in other cases, a more or less graded dopant profile in the depth direction, i.e., in FIG. 2C, the vertical direction, may be implemented in the doped region 221, if considered appropriate. In other cases, a P-type dopant species may be incorporated, depending on the required overall transistor characteristics.

The doped semiconductor region 201B formed in the second device region 200B may have, in some illustrative embodiments, a configuration similar to the doped region 221 when the same type of dopant species and the same type of dopant profile may meet the requirements for a transistor element to be formed in the second device region 200B. In other cases, the doped region 201B may be specifically designed so as to meet the requirements of transistor elements with respect to providing a back bias control mechanism in combination with a "standard" gate electrode structure still to be formed above the second device region 200B. It should be appreciated that additional doped regions may be provided in the first and second device regions 200A, 200B as required, for instance, in order to electrically isolate the regions 221 and/or 201B from the substrate material 201 and the like.

Generally, the doped regions 221, 201B may be formed on the basis of an appropriate implantation sequence, including respective lithography processes and masking techniques. For example, when transistor elements that require a dopant profile appropriate for the doped semiconductor region 221 have to be formed in the second device region 200B, a respective implantation mask may be formed so as to expose respective areas in the second device region 200B and the first device region 200A in order to implant a corresponding dopant species. In other cases, respective implantation processes may be performed specifically for any type of transistor elements to be formed in the first and second device regions 200A, 200B, thereby requiring respective implantation masks. In particular, when the doped semiconductor region 221 may be formed on the basis of the same process recipe as is also applied to one of the transistor types to be formed in and above the second device region 200B, no additional process steps would be required for providing the doped semiconductor region 221 in the first device region 200A compared to a standard process flow for forming transistors in the second device region 200B.

In other illustrative embodiments (not shown), the process sequence as described with reference to FIGS. 2B and 2C may be performed in different order. That is, one or both of the doped semiconductor regions 201B, 221 may be formed on the basis of the above-described process techniques and subsequently the openings 206 for exposing the surfaces 201S (see FIG. 2B) may be formed.

FIG. 2D schematically illustrates a cross-sectional view of the semiconductor device 200 in a further advanced manufacturing stage. As illustrated, a gate electrode structure 220B may be formed on the semiconductor layer 203 of the second device region 200B so as to comply with the requirements for low power transistor elements to be formed in the second device region 200B. For instance, the gate electrode structure 220B may comprise a gate dielectric material 222B of any appropriate configuration, wherein, in sophisticated applications, the gate dielectric material 222B may include a high-k dielectric material, which is to be understood as a dielectric material having a permittivity of 20 or higher. In this case, a metal-containing material 224 may be provided as a barrier material and/or a material for increasing overall conductivity and/or adjusting the threshold voltage of a transistor still to be formed. Furthermore, an electrode material 221B, such as polycrystalline silicon, amorphous silicon, silicon/germanium and the like, or any combination thereof, may be provided together with a dielectric cap material 225, such as a silicon nitride material and the like. It should be appreciated that, in sophisticated semiconductor devices, a length of the gate electrode structure 220B may be in the range of 30 nm and significantly less, such as 28 nm, 22 nm and less. It should further be appreciated that still other transistor elements may be present in the second device region 200B, which may have a different configuration with respect to a transistor element to be formed on the basis of the gate electrode structure 220B. For instance, the gate electrode structure 220B may represent a gate electrode structure for an N-type transistor, while a similar gate electrode structure (not shown) may be provided for a P-type transistor.

Furthermore, in this manufacturing stage, a layer of spacer material 226B may be formed above the semiconductor device 200 with a material composition that is appropriate for forming spacer elements in a subsequent process sequence. For instance, the spacer layer 226B may be provided in the form of a silicon nitride material of appropriate thickness. Furthermore, an etch mask 207, such as a resist material and the like, may be provided so as to cover any portions of the semiconductor device 200 on which the spacer layer 226B is to be preserved during some further process steps. In the example shown, it may be assumed that the spacer layer 226B may be exposed in other areas of the second device region 200B, in which a sidewall spacer is to be formed on a respective gate electrode structure 220B (not shown), for instance, a gate electrode structure of a transistor type of inverse conductivity type compared to the transistor still to be formed on the basis of the gate electrode structure 220B as illustrated. The layers 226B and 207 may be formed on the basis of well-established process techniques, including deposition techniques, lithography processes and the like. Thereafter, an etch process may be performed so as to form sidewall spacers on any respective gate electrode structures that are not covered by the mask layer 207 in the second device region 200B. On the other hand, the spacer layer 226B is reliably covered by the mask layer 207 on the first device region 200A and in respective areas of the second device region 200B, such as the area around the gate electrode structure 220B as shown.

Figure 2E:
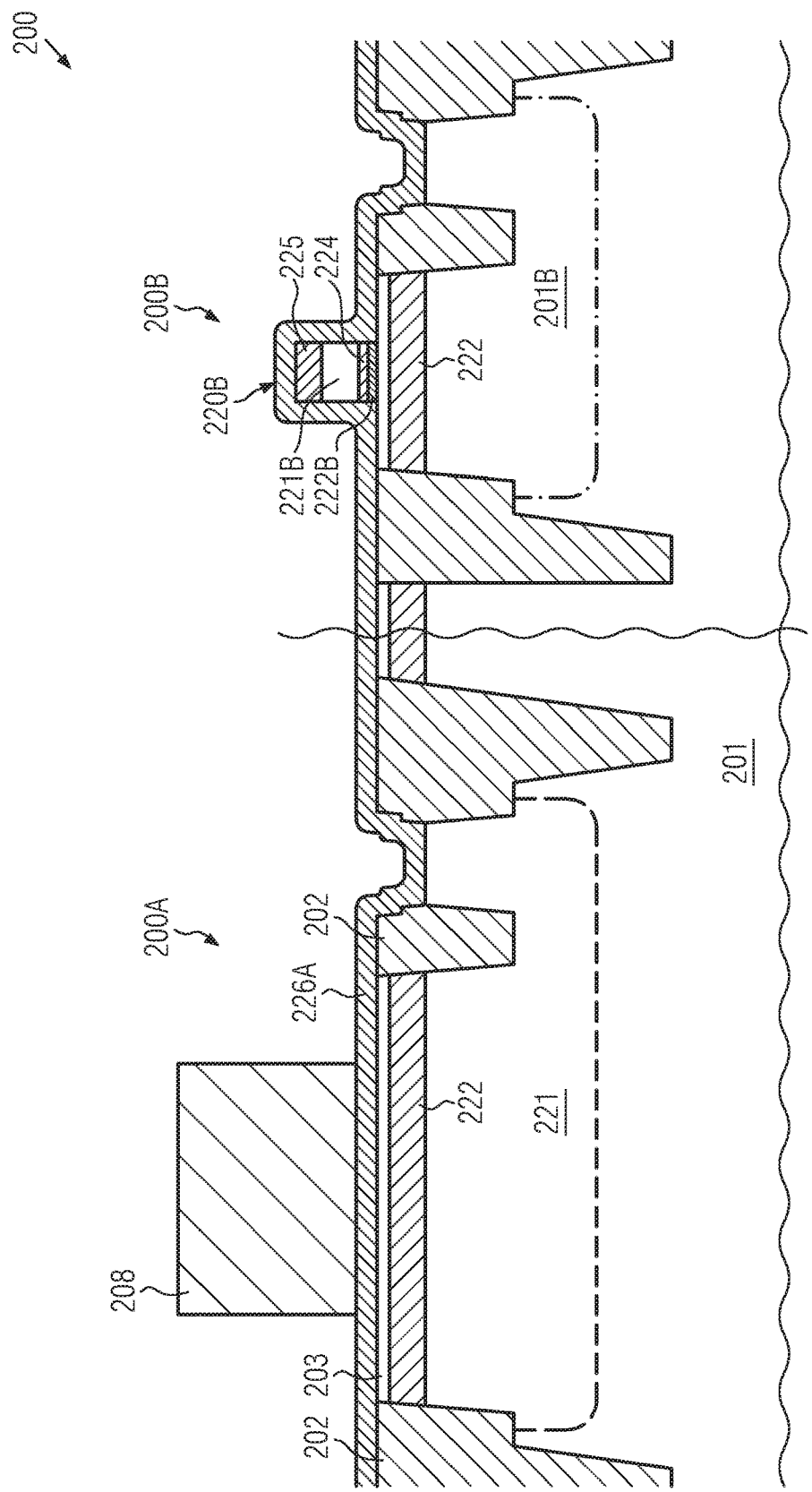

FIG. 2E schematically illustrates the semiconductor device 200 in a further advanced manufacturing stage, in which a further spacer material 226A may be formed, thereby providing, in combination with the previously formed and non-removed portions of the spacer layer 226B (see FIG. 2D and not shown in FIG. 2E), a desired overall thickness of a spacer material for forming sidewall spacers on respective gate electrode structures. To this end, any well-established deposition recipes may be applied for forming, for instance, a silicon nitride material. Furthermore, a mask layer, such as a resist material and the like, may be formed and may be patterned by lithography so as to obtain a mask 208 positioned above the spacer layer 226A in the first device region 200A, thereby exposing portions that may correspond to drain and source regions still to be formed in the first device region 200A.

Figure 2F:
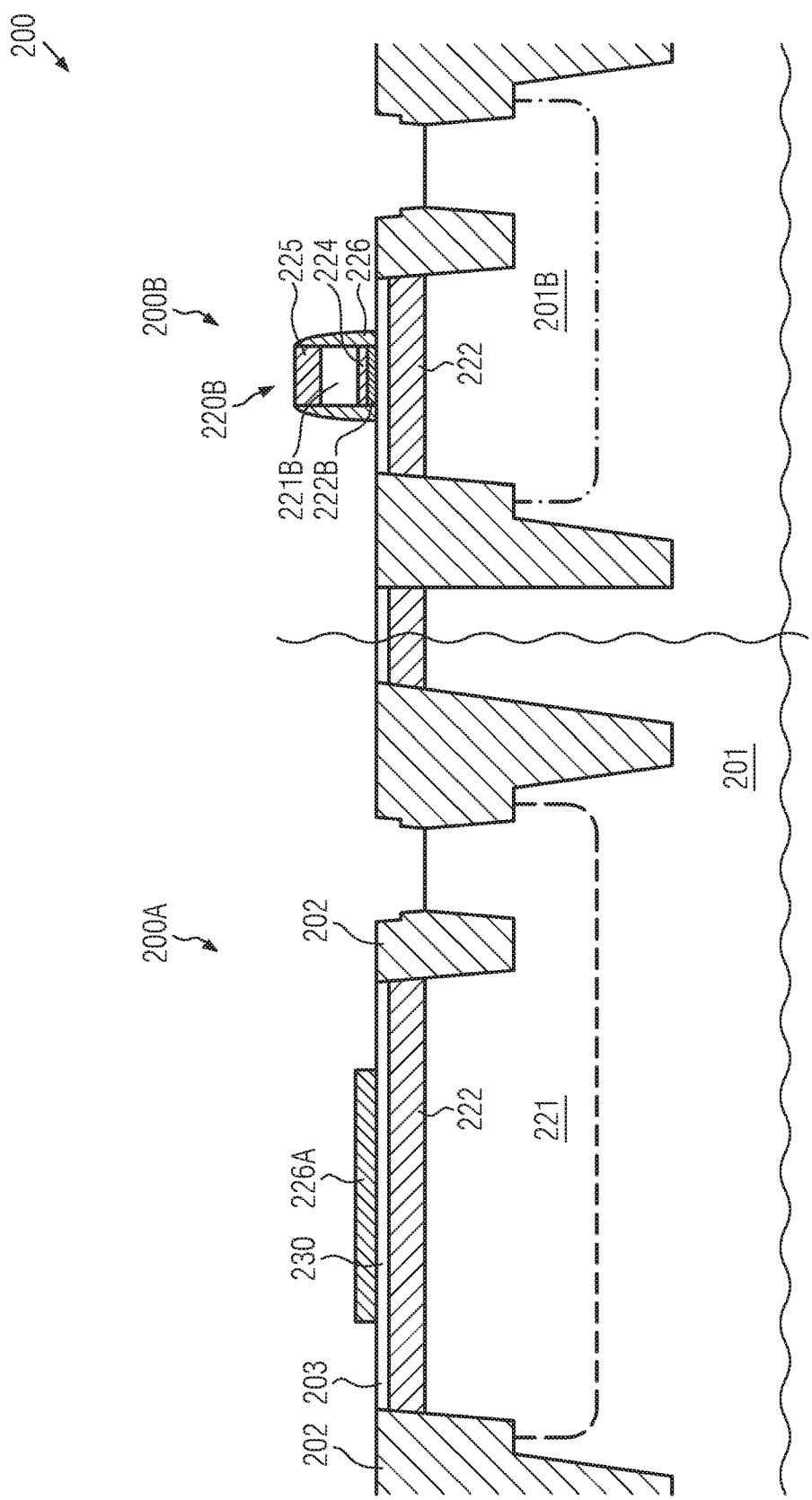

FIG. 2F schematically illustrates the semiconductor device 200 in a manufacturing stage in which an etch process may have been performed on the basis of the configuration as shown in FIG. 2E, thereby removing any exposed portions of the spacer layer 226A (see FIG. 2E). Consequently, at any non-covered gate electrode structures 220B in the second device region 200B, respective spacers 226 may be formed, while, in other areas, including gate electrode structures covered by the mask 208 (see FIG. 2E), previously formed spacer elements in combination with portions of the layer 226A may still be present. Similarly, a portion of the layer 226A, also indicated by the same reference numeral, may be provided on the semiconductor layer 203 in the first device region 200A, thereby substantially defining the size, shape and position of a channel region 230 in the semiconductor layer 203. The configuration as shown in FIG. 2F may be obtained on the basis of well-established anisotropic etch recipes, followed by the removal of any mask material of the mask 208 (see FIG. 2E). Consequently, in this manufacturing stage, respective drain and source areas of low power transistors to be formed in the second device region 200B may be exposed, while, in other areas of the second device region 200B, respective semiconductor areas may still be covered by portions of the layer 226A. It should be appreciated that in the configuration shown in FIG. 2F, drain and source regions may be formed in a common process sequence for a transistor to be formed on the basis of the gate electrode structure 220B as illustrated in FIG. 2F and for the transistor still to be formed in the first device region 200A. Consequently, a respective process or process sequence may be applied so as to prepare any exposed semiconductor surface areas for the deposition of a highly in situ doped semiconductor material. To this end, any well-established process recipes may be applied.

Figure 2G:
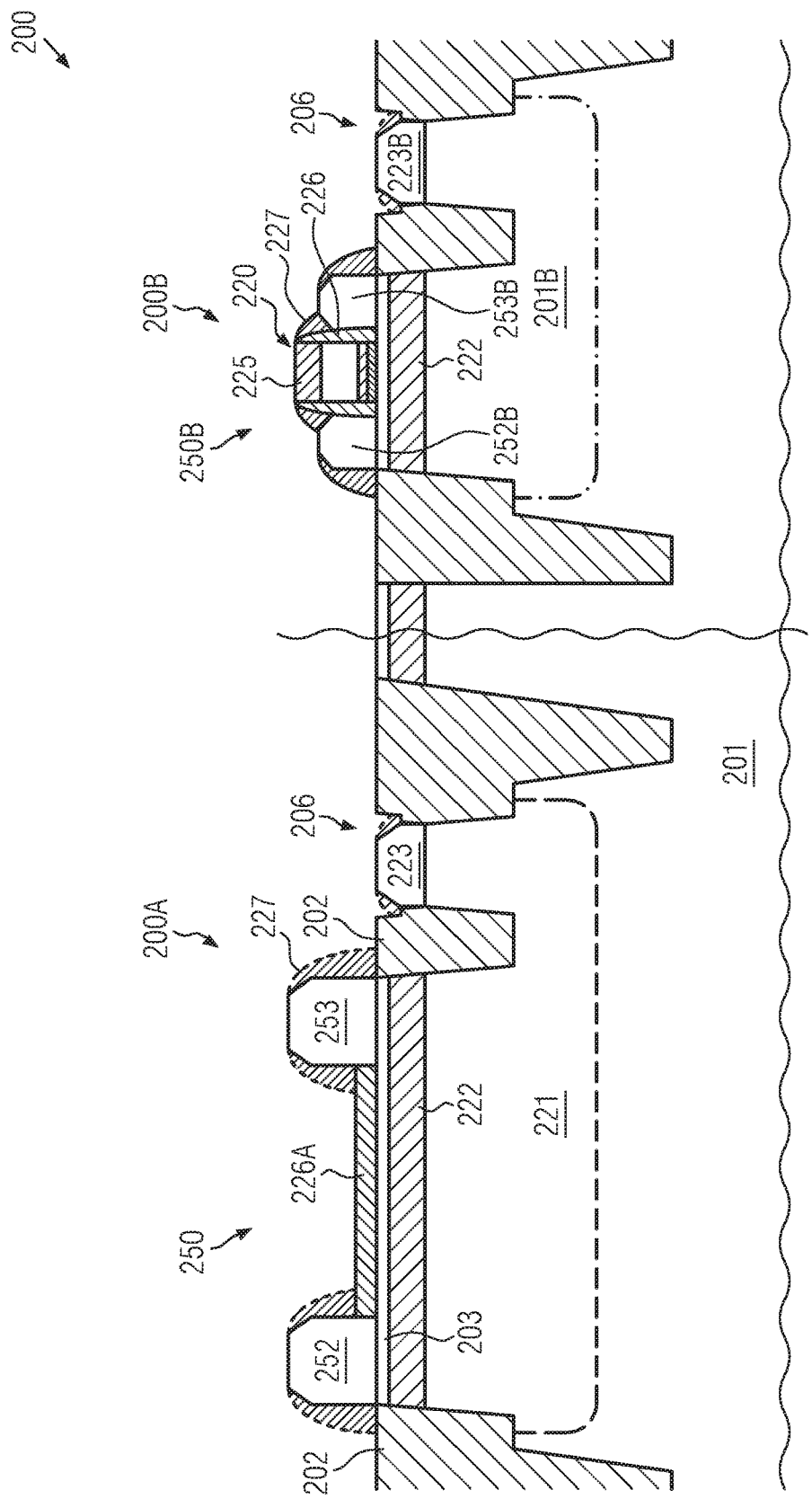

FIG. 2G schematically illustrates a cross-sectional view of the semiconductor device 200 in a still further advanced manufacturing state. As illustrated, drain and source regions 253, 252 of a transistor 250 may be formed laterally adjacent to the spacer material 226A, wherein the drain and source regions 253, 252 may represent a highly doped semiconductor material, such as a highly N-doped semiconductor material when the transistor 250 is to represent an N-type transistor. Similarly, in the area 206 of the first device region 200A, a contact region 223 formed of a highly doped semiconductor material is provided so as to connect to the doped semiconductor region 221. The contact region 223 may have substantially the same configuration along a height direction, i.e., the vertical direction of FIG. 2G, with respect to material composition and dopant concentration as the drain and source regions 253, 252.

In the second semiconductor region 200B, a transistor 250B may comprise the gate electrode structure 220 including the spacers 226 previously formed on the basis of the spacer material 226A, as discussed above, wherein respective drain and source regions 253B, 252B may be formed adjacent to the gate electrode structure 220. Similarly, a contact region 223B may be formed in the respective area 206 so as to connect to the doped region 201B. It should be appreciated that the drain and source regions 253, 252 of the transistor 250 and the drain and source regions 253B, 252B of the transistor 250B may have substantially the same configuration, except for lateral dimensions thereof, since, in the embodiments shown, it may be assumed that these regions, as well as the respective contact regions 223, 223B, may have been formed on the basis of a common selective epitaxial growth process. Furthermore, other transistors in the second semiconductor region 200B may be provided and may have basically the same configuration as the transistor 250B, except for oppositely doped drain and source regions and a respective contact region, wherein the doped region below the buried insulating layer 222 may also have an inverse doping, as is also discussed above.

Furthermore, in this manufacturing stage, additional sidewall spacers 227 may be formed on the gate electrode structure 220 and the raised drain and source regions 253B, 252B, wherein these spacers 227 may be formed of any appropriate material, such as silicon dioxide and the like. In some illustrative embodiments, the spacers 227 may also be optionally provided on sidewalls of the drain and source regions 253, 252 and the contact region 223 of the transistor 250, when superior integrity of the underlying semiconductor layer 203 after removal of the spacer material 226A is desired.

The semiconductor device 200 as shown in FIG. 2G may be formed on the basis of the following processes. When starting from the configuration as shown in FIG. 2F, a selective epitaxial growth process may be performed so as to deposit a crystalline semiconductor material on exposed portions of the semiconductor layer 203 in the first and second device regions 200A, 200B, while the semiconductor layer 203 in other device regions (not shown) of the second device region 200B may still be covered by the remaining portions of the material 226A. During the respective selective epitaxial growth process, an appropriate dopant species may also be incorporated. Thereafter, any masked areas (not shown) still covered by the material 226A may be exposed by applying a respective selective etch process, wherein a further mask material, such as silicon nitride, may be deposited prior to performing the etch process and may be covered by a respective lithography mask. After exposing the respective semiconductor areas and removing the lithography mask, a further selective epitaxial growth process may be applied so as to deposit an appropriately in situ doped semiconductor material in order to form respective drain and source regions (not shown). It should be appreciated that coverage of the previously deposited drain and source regions 253, 252, 253B, 252B may be omitted if these areas may be significantly different in material composition with respect to the material to be deposited in the subsequent epitaxial growth process and, therefore, significant material deposition on the previously formed drain and source regions is effectively suppressed.

Thereafter, a spacer layer may be deposited and may be anisotropically etched so as to form the spacer elements 227 in the second device region 200B and, optionally, in the first device region 200A.

Thereafter, well-established etch recipes may be applied so as to remove the silicon nitride cap layer 225 in the gate electrode structures 220 in the second device region 200B, thereby also removing the spacer material 226A in the first device region 200A, possibly in combination with any other silicon nitride-based mask material that may have been previously used for growing the respective semiconductor material for the drain and source regions 253B, 252B and the corresponding contact regions 223B.

Figure 2H:
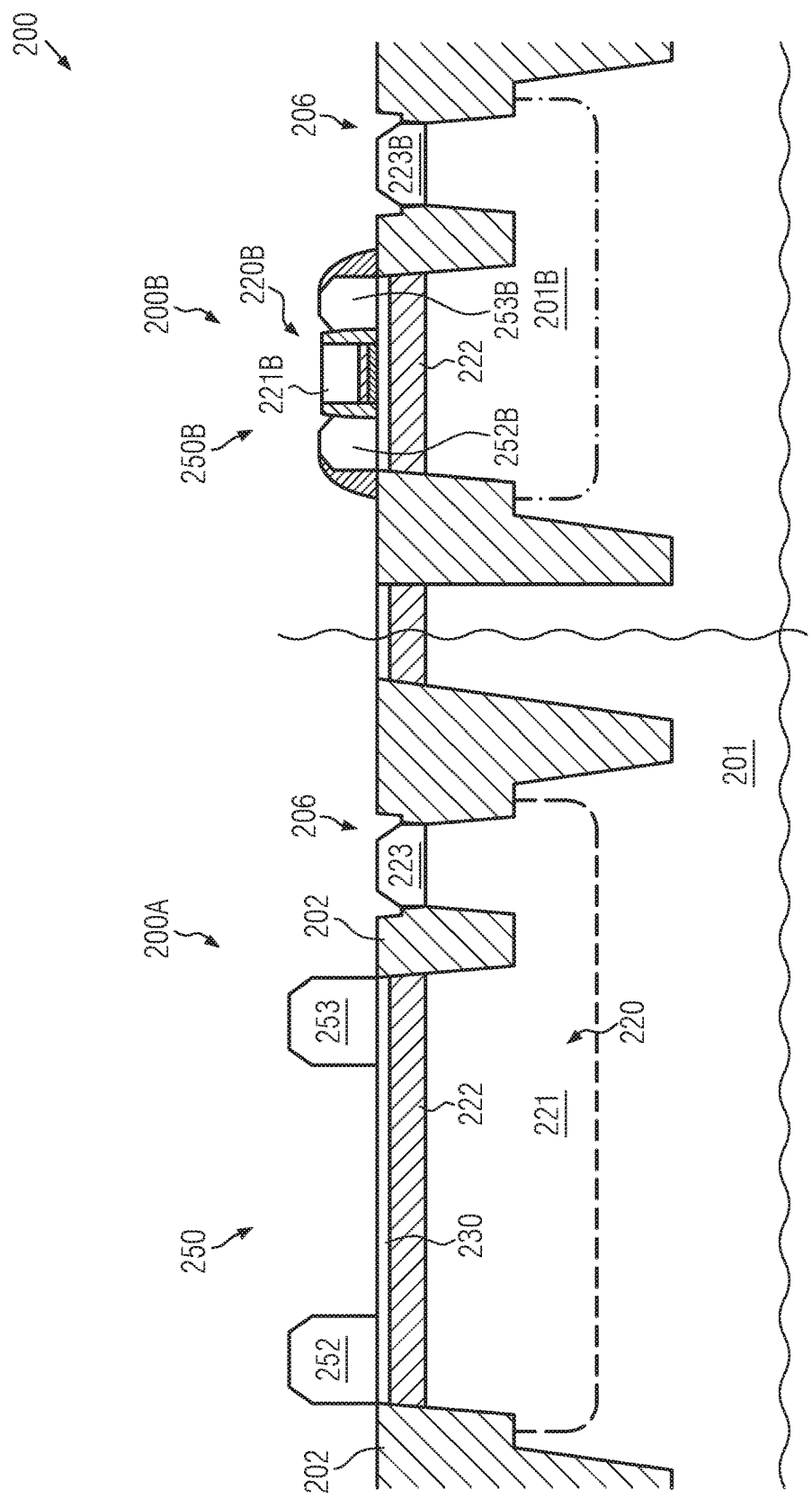

FIG. 2H schematically illustrates the semiconductor device 200 after completing the above-described process sequence. That is, the transistor 250 may comprise the drain and source regions 253, 252 and a gate electrode structure 220 formed by the doped semiconductor region 221 as electrode material, the buried insulating layer 222 as gate dielectric and the contact region 223 as a highly-doped contact area for receiving a control voltage to be applied to the doped semiconductor region 221. Furthermore, in this manufacturing stage, the semiconductor material of the channel region 230 may be exposed due to the preceding removal of any mask material.

In the second device region 200B, the transistor 250B, as well as any other transistors formed in the second device region 200B, may comprise the gate electrode structure 220B in a form in which the electrode material 221B may be exposed due to the previous removal of the cap material 225 (see FIG. 2G). Consequently, in this manufacturing stage, substantially completed transistor structures may be provided in the first and second device regions 200A, 200B, wherein, in some illustrative embodiments, the small signal or low power transistors 250B in the second device region 200B may have a fully depleted configuration, as previously discussed. Similarly, in some illustrative embodiments, the transistor 250 in the first device region 200A may be provided as a fully depleted transistor element, wherein the channel region 230 may be appropriately adapted, for instance, with respect to dopant concentration, thickness, material composition and the like so as to comply with the specific requirements for the transistor 250. In particular, due to the increased physical thickness of the gate dielectric layer, i.e., the buried insulating layer 222, the transistor 250 is appropriately adapted to be operated on the basis of moderately high supply voltages, depending on the overall configuration of the transistor 250. It should be appreciated that a plurality of transistors 250 may be formed in the first device region 200A, wherein certain differences in configuration may be implemented when different types of high voltage transistors may be required. Moreover, it should be appreciated that the transistor 250 may have the configuration and characteristics as also discussed above in the context of the semiconductor device 100 shown in and explained on the basis of FIGS. 1A-1D.

Figure 2I:
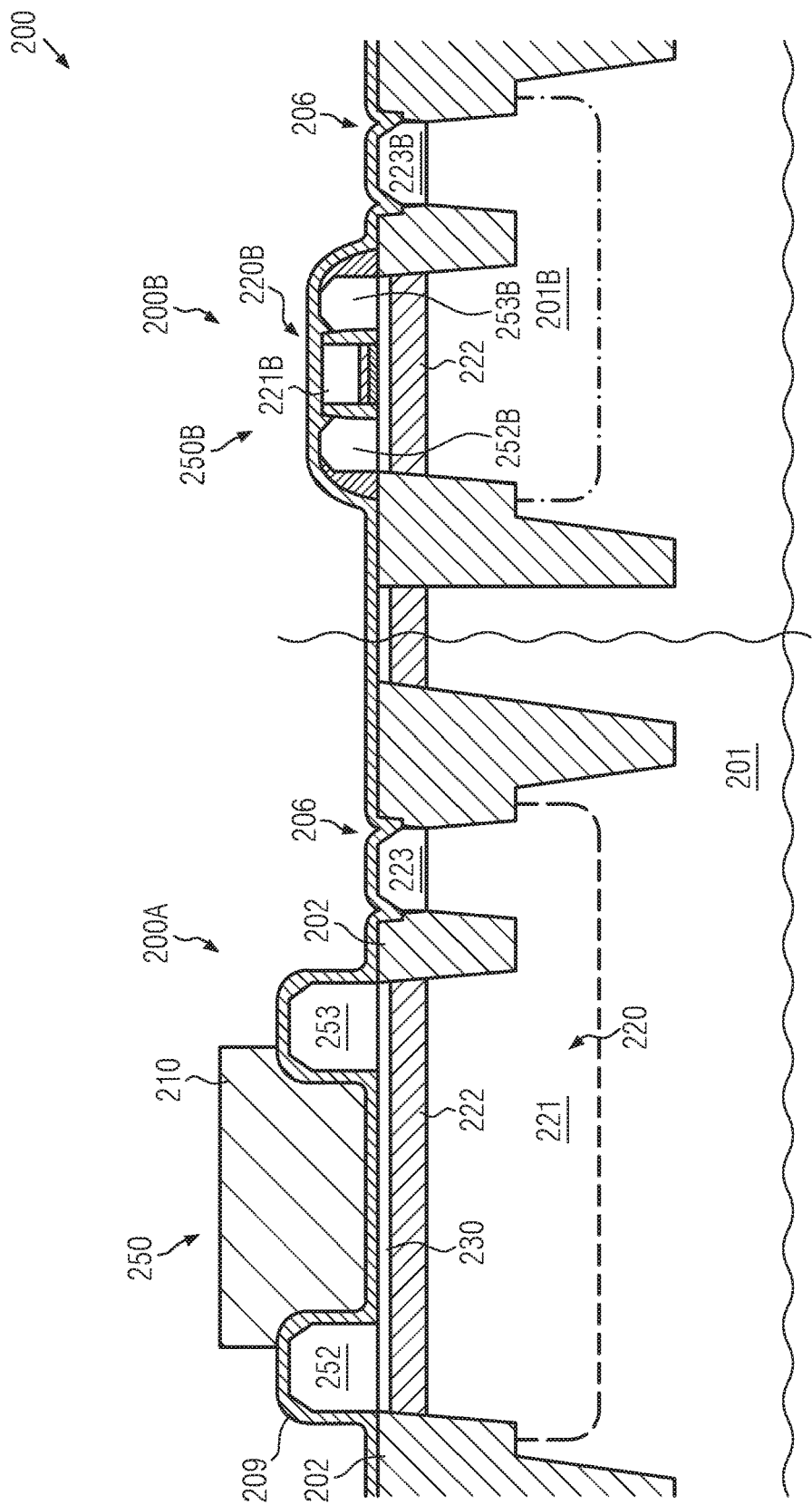

FIG. 2I schematically illustrates the semiconductor device 200 in a further advanced manufacturing stage. As illustrated, a mask layer 209, such as silicon nitride and the like, may be formed above the first and second device regions 200A, 200B. To this end, any well-established deposition technique may be applied. Furthermore, an etch mask 210 may be formed in the first device region 200A so as to cover a portion of the transistor 250, thereby exposing respective outer portions of the drain and source regions 253, 252. The mask 210 may be formed on the basis of any well-established lithography techniques. Thereafter, an etch process may be performed on the basis of well-established recipes so as to remove exposed portions of the mask layer 209. To this end, wet chemical etch recipes or plasma-assisted etch recipes are available.

Figure 2J:
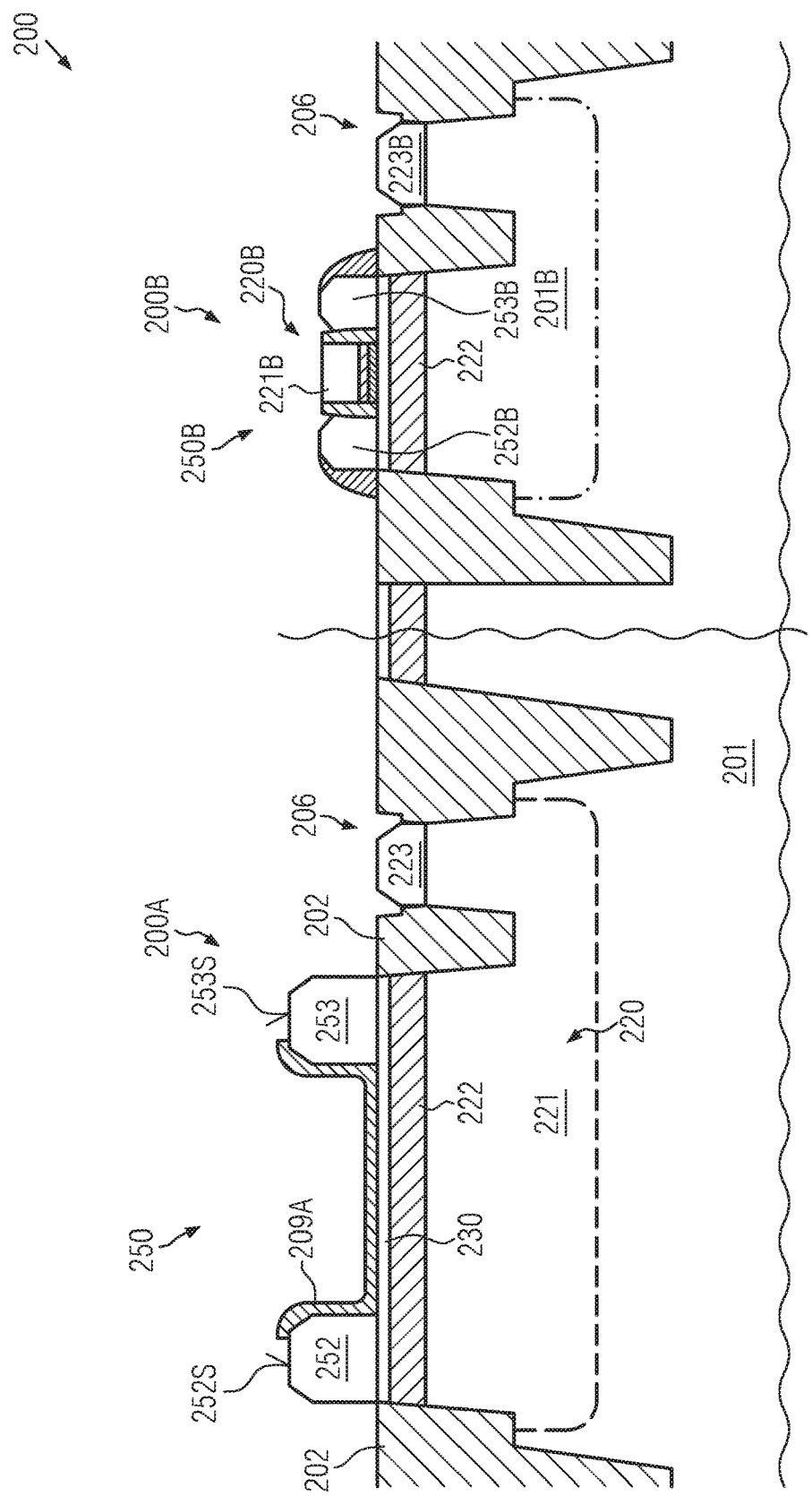

FIG. 2J schematically illustrates the semiconductor device 200 in a manufacturing stage in which exposed portions of the mask layer 209 (see FIG. 2I) have been removed and the lithography mask 210 has also been removed. Consequently, the surface of the channel region 230 and adjacent surface areas of the drain and source regions 253, 252 are reliably covered by a portion 209A of the previously patterned mask layer 209, while outer surface areas 252S, 253S of the source and drain regions 252, 253 are exposed. Thereafter, a further process sequence may be applied so as to form a semiconductor metal compound in any exposed surface areas of semiconductor material, such as the surface areas 252S, 253S and any exposed semiconductor surfaces of the transistors, such as the transistor 250B in the second device region 200B. For example, nickel silicide may be formed when the respective exposed semiconductor surface areas may comprise a significant amount of silicon. To this end, well-established deposition, anneal and etch processes may be applied so as to form a desired semiconductor metal compound, such as a nickel silicide material.

Figure 2K:
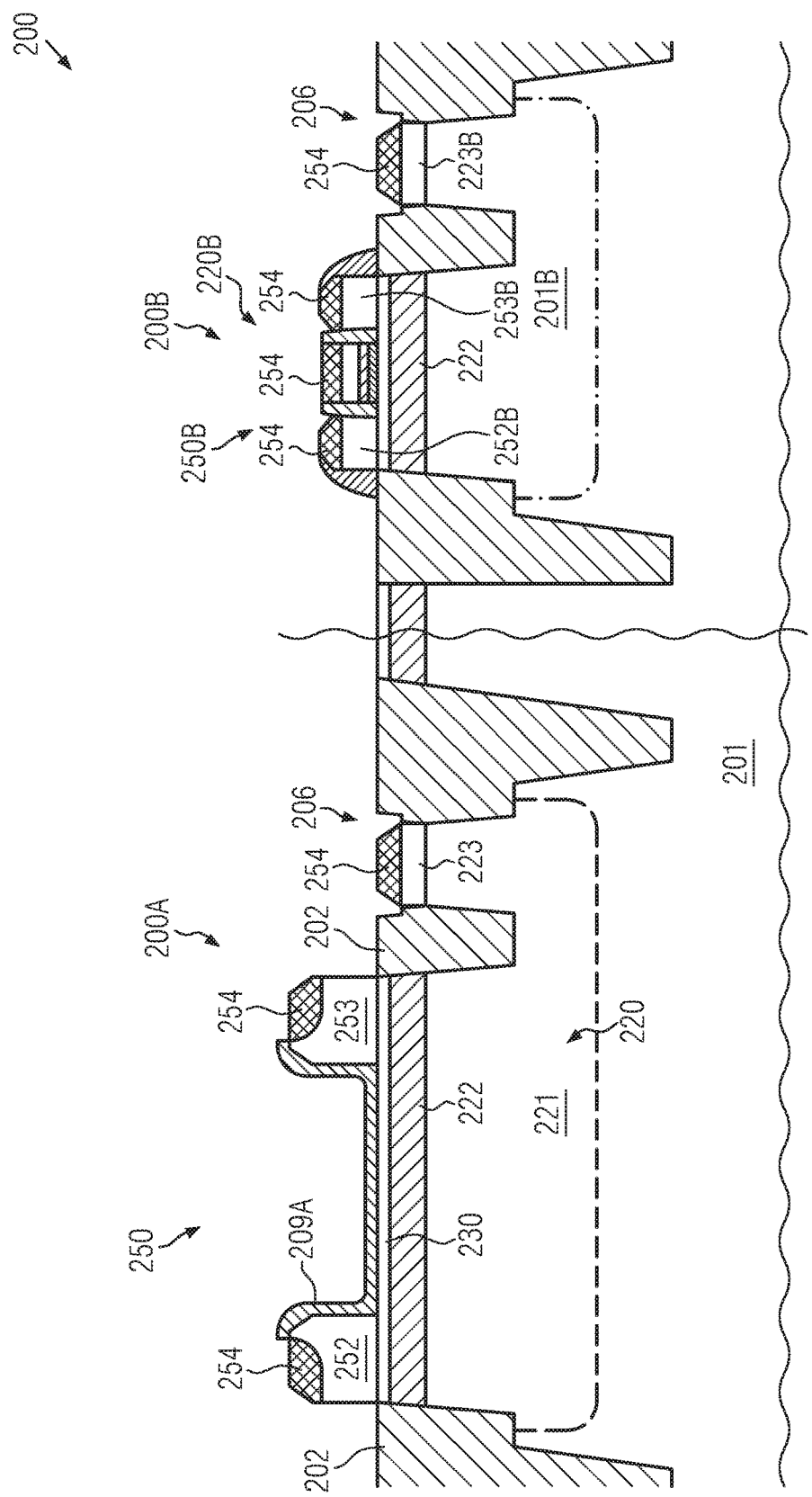

FIG. 2K schematically illustrates the semiconductor device 200 after the above-described process sequence. That is, metal semiconductor compound regions 254 of superior conductivity are formed in and on respective semiconductor surface areas, wherein, in particular, in the transistor 250, the portion 209A of the mask material may reliably prevent the region 254 from being formed in the channel region 230. Consequently, the respective contact areas of the transistors 250, 250B may have formed thereon the respective metal semiconductor compounds 254, thereby providing superior contact resistance. Thereafter, the further processing may be continued by forming a contact level in accordance with well-established process strategies.

It should be appreciated that, at any appropriate point in time during the entire process flow of the semiconductor device 200, respective heat treatments, anneal processes and the like may be performed so as to comply with the overall requirements, for instance, for activating dopant species, adjusting material characteristics and the like. For convenience, any such anneal processes are not specifically described herein.

Figure 2L:
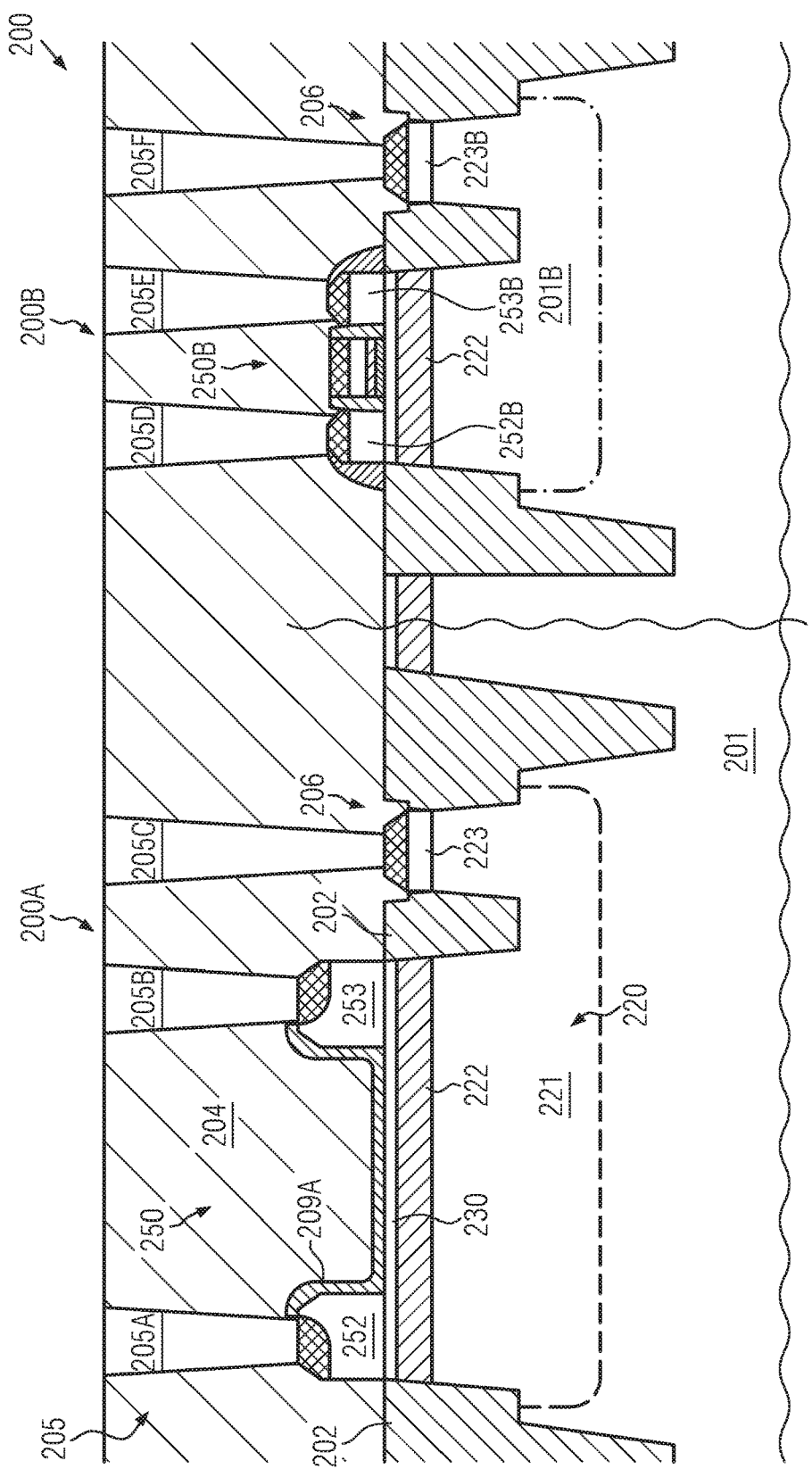

FIG. 2L schematically illustrates a cross-sectional view of the semiconductor device 200 in a further advanced manufacturing stage in which a contact level 205 may be formed above the first and second device regions 200A, 200B. As shown, the contact level 205 may comprise one or more dielectric materials 204, such as silicon nitride, silicon dioxide and the like, wherein, for convenience, any such different material layers, if provided, are not shown in FIG. 2L. Furthermore, respective contact elements 205A-205F may be provided so as to connect to the drain and source regions of the transistor 250 and to the contact region 223, which represents a contact region of the gate electrode structure 220, as previously discussed, and to also connect to the drain and source regions of the transistor 250B and the contact region 223B that may be used for applying an appropriate back bias voltage, if required. It should be further appreciated that, in some illustrative embodiments, as shown in FIG. 2L, the mask material 209A may also represent a portion of the dielectric material 204, which may be provided in the first device region 200A. In this respect, it is to be noted that, in the embodiment shown in FIG. 2L, the dielectric material 204 including the mask material 209A may be formed between the drain and source regions 253, 252 so as to continuously extend therebetween without any further device structure being positioned therebetween. That is, in the embodiment shown in FIG. 2L, the dielectric materials 209A, 204 of the connect level 205, may extend in a non-interrupted manner between the drain region 253 and the source region 252.

The contact level 205 may be formed in accordance with well-established process strategies, for instance, involving the deposition of one or more interlayer dielectric materials, such as silicon nitride, followed by silicon dioxide, and the like, followed by appropriate planarization techniques, as required. Thereafter, openings for the contact elements 205A-205F may be formed on the basis of lithography and etch recipes, followed by the deposition of any appropriate conductive material and the removal of any excess material thereof.

As a result, the present disclosure provides semiconductor devices and manufacturing techniques in which a transistor with increased breakdown voltage may be obtained on the basis of an SOI configuration, in which the buried insulating layer may be used as a gate dielectric material, while the substrate material formed below the buried insulating layer may act as a gate electrode material. In illustrative embodiments, a fully depleted configuration may be obtained by appropriately selecting the characteristics of the channel region, for instance, in view of thickness and/or dopant concentration, thereby improving controllability and charge carrier speed in the respective channel region. In some illustrative embodiments, a high degree of compatibility with the process regime applied to the low power transistors may be achieved, in particular, for fully depleted SOI transistors, thereby providing the possibility of integrating high voltage transistors into sophisticated low power applications without requiring significant modifications of the overall process flow.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device, comprising:
   a channel region in a semiconductor layer;
   drain and source regions positioned on said semiconductor layer so as to laterally connect to said channel region;
   a buried insulating layer including a portion positioned below said channel region;
   a doped region positioned below said buried insulating layer and connected to a gate contact region, said portion of said buried insulating layer and said doped region forming a gate electrode structure of a transistor element; and
   an interlayer dielectric material laterally extending continuously between said drain region and said source region across an entire height of said drain region and said source region.

2. The semiconductor device of claim 1, wherein a thickness of said buried insulating layer is 30 nm or less.

3. The semiconductor device of claim 1, wherein a thickness of said semiconductor layer is 15 nm or less.

4. The semiconductor device of claim 1, wherein said doped region is delineated in a transistor length direction by a trench isolation structure.

5. The semiconductor device of claim 1, wherein said doped region is embedded in a substrate material and is, in a transistor length direction, laterally offset from a trench isolation structure.

6. The semiconductor device of claim 1, further comprising a fully depleted transistor element including a gate electrode structure formed above said buried insulating layer, wherein said fully depleted transistor element has an operating voltage of 2V or less.

7. The semiconductor device of claim 6, wherein said gate electrode structure of said low power transistor element comprises a high-k dielectric material.

8. The semiconductor device of claim 1, wherein said drain and source regions are formed on said semiconductor layer as raised drain and source regions.

9. A transistor element, comprising:
   a channel region positioned between a drain region and a source region;
   a portion of a buried insulating layer positioned below at least said channel region;
   a doped semiconductor region positioned below said portion of said buried insulating layer and connected to a control terminal, said portion of said buried insulating layer and said doped semiconductor region forming a gate electrode structure; and
   an interlayer dielectric material laterally extending continuously between said drain region and said source region across an entire height of said drain region and said source region.

10. The transistor element of claim 9, wherein a physical thickness of said channel region is 15 nm or less.

11. The transistor element of claim 9, wherein said drain and source regions are raised semiconductor regions.

12. The transistor element of claim 9, wherein said doped semiconductor region is laterally delineated in a transistor length direction by a trench isolation structure.

13. The transistor element of claim 9, wherein said doped semiconductor region is laterally offset from said drain and source regions in a transistor length direction.

14. The transistor element of claim 9, wherein a thickness of said portion of said buried insulating layer is 10 nm and greater.

15. A method, comprising:
   forming a gate electrode structure of a transistor element by doping a portion of a substrate material of a semiconductor substrate below a portion of a buried insulating layer;
   forming a drain region and a source region on a semiconductor layer formed on said buried insulating layer; and
   forming an interlayer dielectric material laterally extending continuously between said drain region and said source region across an entire height of said drain region and said source region.

16. The method of claim 15, wherein doping said portion of said substrate material comprises forming said portion so as to be laterally delineated in a transistor length direction by a trench isolation structure.

17. The method of claim 15, wherein doping said portion of said substrate material comprises forming said portion so as to be embedded in said substrate material and laterally offset in a transistor length direction from a trench isolation structure.

18. The method of claim 15, further comprising forming at least one further transistor element with second drain and source regions in said semiconductor layer and with a gate electrode structure formed on said semiconductor layer and positioned laterally between said second drain and source regions.

19. The method of claim 15, wherein forming said drain region and said source region comprises:
   forming a spacer layer above said semiconductor layer;
   forming a mask above said spacer layer;
   patterning said spacer layer in the presence of said mask; and
   forming said drain region and said source region in the presence of said patterned spacer layer.

20. The method of claim 19, further comprising:
   forming said spacer layer above a gate electrode structure of a further transistor; and
   patterning said spacer layer to define spacers adjacent said gate electrode structure.

* * * * *